US008643038B2

(12) United States Patent
Collins et al.

(10) Patent No.: US 8,643,038 B2
(45) Date of Patent: Feb. 4, 2014

(54) WARM WHITE LEDS HAVING HIGH COLOR RENDERING INDEX VALUES AND RELATED LUMINOPHORIC MEDIUMS

(75) Inventors: Brian Thomas Collins, Holly Springs, NC (US); Jasper Cabalu, Apex, NC (US)

(73) Assignee: Cree, Inc., Durham, NC (US)

( * ) Notice: Subject to any disclaimer, the term of this patent is extended or adjusted under 35 U.S.C. 154(b) by 132 days.

(21) Appl. No.: 12/720,390

(22) Filed: Mar. 9, 2010

(65) Prior Publication Data

US 2011/0220929 A1 Sep. 15, 2011

(51) Int. Cl.
*H01L 33/50* (2010.01)
*H01J 1/63* (2006.01)

(52) U.S. Cl.
USPC .......... 257/98; 257/94; 257/99; 257/E33.061; 313/503; 252/301.4 R; 252/301.36

(58) Field of Classification Search
None
See application file for complete search history.

(56) References Cited

U.S. PATENT DOCUMENTS

| 6,600,175 | B1 | 7/2003 | Baretz et al. | |
|---|---|---|---|---|
| 7,095,056 | B2 | 8/2006 | Vitta et al. | |
| 7,213,940 | B1 | 5/2007 | Van De Ven et al. | |
| 7,391,060 | B2 * | 6/2008 | Oshio | 257/98 |
| 7,485,243 | B2 * | 2/2009 | Hintzen et al. | 252/301.4 F |
| 7,507,354 | B2 * | 3/2009 | Oshio | 252/301.4 F |
| 7,608,862 | B2 * | 10/2009 | Sakuma et al. | 257/98 |
| 7,615,797 | B2 * | 11/2009 | Oshio | 257/98 |
| 7,651,634 | B2 * | 1/2010 | Oshio | 252/301.4 F |
| 7,705,093 | B2 * | 4/2010 | Kashiwagi et al. | 525/474 |
| 7,811,472 | B2 * | 10/2010 | Oshio | 252/301.4 F |
| 7,821,194 | B2 | 10/2010 | Negley et al. | |
| 8,104,908 | B2 * | 1/2012 | Harbers et al. | 362/84 |
| 8,125,137 | B2 | 2/2012 | Medendorp, Jr. et al. | |
| 2004/0007961 | A1 | 1/2004 | Srivastava et al. | |
| 2004/0104391 | A1 | 6/2004 | Maeda et al. | |
| 2004/0256974 | A1 * | 12/2004 | Mueller-Mach et al. | 313/485 |
| 2006/0285324 | A1 * | 12/2006 | Ansems et al. | 362/231 |
| 2007/0045645 | A1 * | 3/2007 | Yoon et al. | 257/98 |
| 2008/0179611 | A1 | 7/2008 | Chitnis et al. | |

(Continued)

FOREIGN PATENT DOCUMENTS

JP 2006016251 A 1/2006
JP 2006049799 A 2/2006

(Continued)

OTHER PUBLICATIONS http://en.wikipedia.org/wiki/Cyan n.d.*

(Continued)

*Primary Examiner* — Thomas L Dickey
*Assistant Examiner* — Joseph Schoenholtz
(74) *Attorney, Agent, or Firm* — Myers Bigel Sibley & Sajovec, P.A.

(57) ABSTRACT

Light emitting devices include a solid state lighting source and a recipient luminophoric medium for down-converting at least some of the radiation emitted by the solid state lighting source. The recipient luminophoric medium includes a first material that down-converts the radiation emitted by the solid state lighting source to radiation having a peak wavelength in the green color range that has a full width half maximum emission bandwidth that extends into the cyan color range, and at least one additional material that down-converts the radiation emitted by the solid state lighting source to radiation having a peak wavelength in another color range.

22 Claims, 12 Drawing Sheets

(56) References Cited

U.S. PATENT DOCUMENTS

| | | | |
|---|---|---|---|
| 2008/0258602 A1* | 10/2008 | Masuda et al. | 313/487 |
| 2009/0108269 A1* | 4/2009 | Negley et al. | 257/88 |
| 2009/0134414 A1* | 5/2009 | Li et al. | 257/98 |
| 2009/0184616 A1* | 7/2009 | Van De Ven et al. | 313/1 |
| 2009/0218581 A1* | 9/2009 | Schmidt et al. | 257/98 |
| 2009/0283721 A1 | 11/2009 | Liu et al. | |
| 2010/0123104 A1 | 5/2010 | Collins et al. | |
| 2010/0252851 A1 | 10/2010 | Emerson et al. | |
| 2010/0289044 A1 | 11/2010 | Krames et al. | |
| 2010/0289045 A1 | 11/2010 | Collins et al. | |
| 2011/0198565 A1* | 8/2011 | Kim | 257/13 |
| 2011/0221330 A1 | 9/2011 | Negley et al. | |

FOREIGN PATENT DOCUMENTS

| | | | |
|---|---|---|---|
| JP | 2009111131 A | 5/2009 | |
| JP | 2009123908 A | 6/2009 | |
| JP | 2009263201 A | 11/2009 | |
| JP | 2009539219 A | 11/2009 | |
| JP | 2010507880 A | 3/2010 | |
| WO | WO 2007023439 A2 | 3/2007 | |
| WO | WO 2008/047290 A1 | 4/2008 | |
| WO | WO 2008047290 * | 4/2008 | G02F 1/13357 |
| WO | WO 2008047290 A1 * | 4/2008 | G02F 1/13357 |

OTHER PUBLICATIONS http://en.wikipedia.org/wiki/Green n.d.*
http://en.wikipedia.org/wiki/Red n.d.*
http://en.wikipedia.org/wiki/Yellow n.d.*
http://en.wikipedia.org/wiki/Blue n.d.*
Lee Seonghoon, and Soo Yeon Soo. "Optimization of Yittium Aluminum Garent: Ce3+ Phosphors for White Lighte Emitting Dioded by Comibnational Chemistry Method." Journal of the Electrochemical Society 149.11 (2002): J85-88.*
Mikami, M., H. Watanabe, K. Uheda, S. Shimooka, Y. Shimomura, T. Kurushima, and N. Kijima. "New Phosphors for White LEDs:." IOP Conference Series: Materials Science and Engineering 1 (2009): 012002.*
http://en.wikipedia.org/wiki/Visible_spectrum n.d.*
Lin, Chun "Advances in Phosphors for Light Emitting Diodes" J. Phys. Chem. Lett. 2011, 2, 1268-1277.*
M. Wood, MacAdam Ellipses, Fall 2010. Retrieved from URL <http://www.mikewoodconsulting.com/articles/Protocol%20Fall%202010%20-%20MacAdam%20ellipses.pdf> on Sep. 28, 2012.*
Zorenko, Y., V. Gorbenko, I. Konstankevych, A. Voloshinovskii, G. Stryganyuk, V. Mikhailin, V. Kolobanov, and D. Spassky. "Single-crystalline Films of Ce-doped YAG and LuAG Phosphors: Advantages over Bulk Crystals Analogues." Journal of Luminescence 114.2 (2005): 85-94.*
Zhang, Kong, Qingfeng Liu, Qian Liu, Yun Shi, and Yubai Pan. "Combinatorial Optimization of (YLu)AIO:CeGreen-Yellow Phosphors." Journal of Combinatorial Chemistry 12.4 (2010): 453-57.*
Wang, Zhifang, Mei Xu, Weiping Zhang, and Min Yin. "Synthesis and Luminescent Properties of Nano-scale LuAG:RE3+ (Ce, Eu) Phosphors Prepared by Co-precipitation Method." Journal of Luminescence 122-123 (2007): 437-39.*
C. Sommer, F. P. Wenzl, P. Hartmann, P. Pachler, M. Schweighart, G. Leising and S. Tasch "Silicate phosphors and white LED technology-Improvements and opportunities", Proc. SPIE, vol. 6669, pp. O6690-O6691 2007.*
Lee, Seonghoon, and Soo Yeon Seo. "Optimization of Yttrium Aluminum Garnet:Ce3+ Phosphors for White Light-Emitting Diodes by Combinatorial Chemistry Method." Journal of the Electrochemical Society 149.11 (2002): J85.*
Setlur, A., and A. Srivastava. "On the Relationship between Emission Color and Ce3+ Concentration in Garnet Phosphors." Optical Materials 29.12 (2007): 1647-652.*
Mikami, M., H. Watanabe, K. Uheda, S. Shimooka, Y. Shimomura, T. Kurushima, and N. Kijima. "New Phosphors for White LEDs" IOP Conference Series: Materials Science and Engineering 1 (2009): 012002.*
American Hertitage Dictionary definition of 'composite'.*
Zorenko, Yu., V. Gorbenko, A. Voloshinovskii, G. Stryganyuk, V. Mikhailin, V. Kolobanov, D. Spassky, M. Nikl, and K. Blazek. "Exciton-related Luminescence in LuAG:Ce Single Crystals and Single Crystalline Films." Physica Status Solidi (a) 202.6 (2005): 1113-119.*
Yanagida, T.; Fujimoto, Y.; Yokota, Y.; Yoshikawa, A.; Ishikawa, T.; Fujimura, H.; Shimizu, H.; Yagi, H.; Yanagitani, T., "Scintillation properties of LuAG (Ce) ceramic and single crystalline scintillator," Nuclear Science Symposium Conference Record (NSS/MIC), 2010 IEEE, vol., No., pp. 1612,1614, Oct. 30, 2010-Nov. 6, 2010.*
International Search Report and Written Opinion of the International Searching Authority for PCT/US2011/027362; Date of Mailing: May 5, 2011; 16 pages.
International Preliminary Report on Patentability Corresponding to International Application No. PCT/US2011/027362; Date of Mailing: Sep. 20, 2012; 10 Pages.
"Visible and Ultraviolet Spectroscopy," an MSU Chemistry Course. Downloaded Apr. 6, 2013 (http://www2.chemistry.msu.edu/faculty/reusch/VirtTxtJml/Spectrpy/UV-Vis/spectrum.htm#uv1).

* cited by examiner

WARM WHITE LEDS HAVING HIGH COLOR RENDERING INDEX VALUES AND RELATED LUMINOPHORIC MEDIUMS

BACKGROUND

The present invention relates to light emitting devices and, more particularly, to light emitting devices that have high color rendering index ("CRT") values.

Light emitting diodes ("LEDs") are well known solid state lighting devices that are capable of generating light. LEDs generally include a plurality of semiconductor layers that may be epitaxially grown on a semiconductor or non-semiconductor substrate such as, for example, sapphire, silicon, silicon carbide, gallium nitride or gallium arsenide substrates. One or more semiconductor p-n junctions are formed in these epitaxial layers. When a sufficient voltage is applied across the p-n junction, electrons in the n-type semiconductor layers and holes in the p-type semiconductor layers flow toward the p-n junction. As the electrons and holes flow toward each other, some of the electrons will "collide" with a hole and recombine. Each time this occurs, a photon of light is emitted, which is how LEDs generate light. The wavelength distribution of the light generated by an LED generally depends on the semiconductor materials used and the structure of the thin epitaxial layers that make up the "active region" of the device (i.e., the area where the electrons and holes recombine).

LEDs typically have a narrow wavelength distribution that is tightly centered about a "peak" wavelength (i.e., the single wavelength where the radiometric emission spectrum of the LED reaches its maximum as detected by a photo-detector). For example, the spectral power distributions of a typical LED may have a full width of, for example, about 10-30 nm, where the width is measured at half the maximum illumination (referred to as the full width half maximum or "FWHM" width). Accordingly, LEDs are often identified by their "peak" wavelength or, alternatively, by their "dominant" wavelength. The dominant wavelength of an LED is the wavelength of monochromatic light that has the same apparent color as the light emitted by the LED as perceived by the human eye. Thus, the dominant wavelength differs from the peak wavelength in that the dominant wavelength takes into account the sensitivity of the human eye to different wavelengths of light.

As most LEDs are almost monochromatic light sources that appear to emit light having a single color, LED lamps that include multiple LEDs that emit light of different colors have been used in order to provide solid state light emitting devices that generate white light. In these devices, the different colors of light emitted by the individual LED chips combine to produce a desired intensity and/or color of white light. For example, by simultaneously energizing red, green and blue light emitting LEDs, the resulting combined light may appear white, or nearly white, depending on the relative intensities of the source red, green and blue LEDs.

White light may also be produced by surrounding a single-color LED with a luminescent material that converts some of the light emitted by the LED to light of other colors. The combination of the light emitted by the single-color LED that passes through the wavelength conversion material along with the light of different colors that is emitted by the wavelength conversion material may produce a white or near-white light. For example, a single blue-emitting LED chip (e.g., made of indium gallium nitride and/or gallium nitride) may be used in combination with a yellow phosphor, polymer or dye such as for example, cerium-doped yttrium aluminum garnet (which has the chemical formula $Y_3Al_5O_{12}$:Ce, and is commonly referred to as YAG:Ce), that "down-converts" the wavelength of some of the blue light emitted by the LED, changing its color to yellow. Blue LEDs made from indium gallium nitride exhibit high efficiency (e.g., external quantum efficiency as high as 60%). In a blue LED/yellow phosphor lamp, the blue LED chip produces an emission with a dominant wavelength of about 450-460 nanometers, and the phosphor produces yellow fluorescence with a peak wavelength of about 550 nanometers in response to the blue emission. Some of the blue light passes through the phosphor (and/or between the phosphor particles) without being down-converted, while a substantial portion of the light is absorbed by the phosphor, which becomes excited and emits yellow light (i.e., the blue light is down-converted to yellow light). The combination of blue light and yellow light may appear white to an observer. Such light is typically perceived as being cool white in color. In another approach, light from a violet or ultraviolet emitting LED may be converted to white light by surrounding the LED with multicolor phosphors or dyes. In either case, red-emitting phosphor particles (e.g., a CaAlSiN3 ("CASN") based phosphor) may also be added to improve the color rendering properties of the light, i.e., to make the light appear more "warm," particularly when the single color LED emits blue or ultraviolet light.

As noted above, phosphors are one known class of luminescent materials. A phosphor may refer to any material that absorbs light at one wavelength and re-emits light at a different wavelength in the visible spectrum, regardless of the delay between absorption and re-emission and regardless of the wavelengths involved. Accordingly, the term "phosphor" may be used herein to refer to materials that are sometimes called fluorescent and/or phosphorescent. In general, phosphors may absorb light having first wavelengths and re-emit light having second wavelengths that are different from the first wavelengths. For example, "down-conversion" phosphors may absorb light having shorter wavelengths and re-emit light having longer wavelengths.

LEDs are used in a host of applications including, for example, backlighting for liquid crystal displays, indicator lights, automotive headlights, flashlights, specialty lighting applications and even as replacements for conventional incandescent and/or fluorescent lighting in general lighting and illumination applications. In many of these applications, it may be desirable to provide a lighting source that generates light having specific properties.

SUMMARY

Pursuant to some embodiments of the present invention, light emitting devices are provided that include a solid state lighting source and a recipient luminophoric medium for down-converting at least some of the radiation emitted by the solid state lighting source. The recipient luminophoric medium includes a first material that down-converts the radiation emitted by the solid state lighting source to radiation having a peak wavelength in the green color range that has a full width half maximum emission bandwidth that extends into the cyan color range, and at least one additional material that down-converts the radiation emitted by the solid state lighting source to radiation having a peak wavelength in another color range.

In some embodiments, the first material may be a first phosphor that down-converts the radiation emitted by the solid state lighting source to a radiation having a peak wavelength between 525 nanometers and 550 nanometers, and has a full width half maximum emission bandwidth that extends below 500 nanometers. In such embodiments, the at least one additional material may be a second phosphor and a third phosphor which together down-convert the radiation emitted by the solid state lighting source to a radiation having a peak wavelength greater than 580 nanometers.

In some embodiments, the first material may be a first phosphor, and the at least one additional material may be a second phosphor that down-converts the radiation emitted by the solid state lighting source to a radiation having a peak wavelength between 530 nanometers and 585 nanometers, and a third phosphor which down-converts the radiation emitted by the solid state lighting source to a radiation having a peak wavelength between 600 nanometers and 660 nanometers. The second phosphor may down-convert the radiation emitted by the solid state lighting source to radiation having a peak wavelength in the yellow color range, and the third phosphor may down-convert the radiation emitted by the solid state lighting source to radiation having a peak wavelength in the red color range.

In some embodiments, the first phosphor may be a Ce:Lu-lutetium aluminum garnet (which has the chemical formula $Lu_3Al_5O_{12}$:Ce phosphor, which is referred to herein as a LuAG:Ce phosphor), the second phosphor comprises a YAG:Ce phosphor, and the third phosphor comprises a $(Ca_{1-x}Sr_x)SiAlN_3:Eu^{2+}$ phosphor. The ratio of the first phosphor to the second phosphor is between 1:3 and 3:1 by weight. In some embodiments, the ratio of the combination of the first and second phosphors to the third phosphor may be in the range between 1:1 and 9:1 by weight. In certain specific embodiments, the ratio of the combination of the first and second phosphors to the third phosphor may be in the range between 1.7:1 and 2.8:1 by weight. The solid state lighting source may be a light emitting diode that emits light having a dominant wavelength in the blue color range such as, for example, about 460 nanometers and 470 nanometers. The first phosphor may be a first aluminum garnet-based phosphor, the second phosphor may be a second aluminum garnet-based phosphor, and the third phosphor may be a nitride- or oxynitride-based phosphor.

The LED emits a warm white light having a correlated color temperature between about 2500K and 3300K and/or a CRI value of at least 90. The light emitted by the light emitting device has a color point that is within 7 MacAdam ellipses of the black-body locus on a 1931 CIE chromaticity diagram. The particle sizes of the first, second and third phosphors are between about 1 micron and 30 microns. At least half the particle of the first, second and third phosphors are between about 2 microns and 24 microns in size.

Pursuant to further embodiments of the present invention, light emitting devices are provided that include a light emitting diode ("LED") that emits light having a dominant wavelength in the blue color range and a recipient luminophoric medium that is configured to down-convert at least some of the light emitted by the LED. The recipient luminophoric medium includes at least a first phosphor that down-converts the radiation emitted by the LED to radiation having a peak wavelength in the green color range, a second phosphor that down-converts the radiation emitted by the LED to radiation having a peak wavelength in a second color range having wavelengths above the green color range, and a third phosphor that down-converts the radiation emitted by the LED to radiation having a peak wavelength in a third color range having wavelengths above the green color range. In some embodiments, the first phosphor may have a full width half maximum emission bandwidth that extends into the cyan color range.

In some embodiments, the second phosphor may down-convert the radiation emitted by the LED to radiation having a peak wavelength in the yellow color range, and the third phosphor may down-convert the radiation emitted by the LED to radiation having a peak wavelength in the red color range. The spectra of the light emission associated with the first, second and third phosphors may include a single peak. Moreover, the spectra of the light emission associated with the first phosphor may not generate a peak in the cyan color range.

Pursuant to still further embodiments of the present invention, light emitting devices are provided that include a light emitting diode ("LED") that emits light having a dominant wavelength in the blue color range and a recipient luminophoric medium that is configured to down-convert at least some of the light emitted by the LED. The recipient luminophoric medium includes a first material that down-converts the radiation emitted by the LED to radiation having a peak wavelength in the green color range and a second material that down-converts the radiation emitted by the LED to radiation having a peak wavelength in a second color range having wavelengths above the green color range. The spectra emitted by the light emitting device has two distinct peaks in the visible spectrum, including a first peak in the blue color range, a second peak at wavelengths longer than the wavelengths associated with the green color range. The first material may have a full width half maximum emission bandwidth that extends into the cyan color range.

In some embodiments, the first phosphor comprises a LuAG:Ce phosphor, the second phosphor comprises a YAG:Ce phosphor, and the third phosphor comprises a $(Ca_{1-x}Sr_x)SiAlN_3:Eu^{2+}$ phosphor.

Pursuant to still further embodiments of the present invention, luminophoric mediums are provided that comprise a binder, a first phosphor that is configured to down-convert blue light to radiation having a peak wavelength in the green color range that has a full width half maximum bandwidth that extends into the cyan color range, a second phosphor that is configured to down-convert blue light to radiation having a peak wavelength in the yellow color range, and a third phosphor that is configured to down-convert blue light to radiation having a peak wavelength in the red color range.

DETAILED DESCRIPTION

Figure 1:
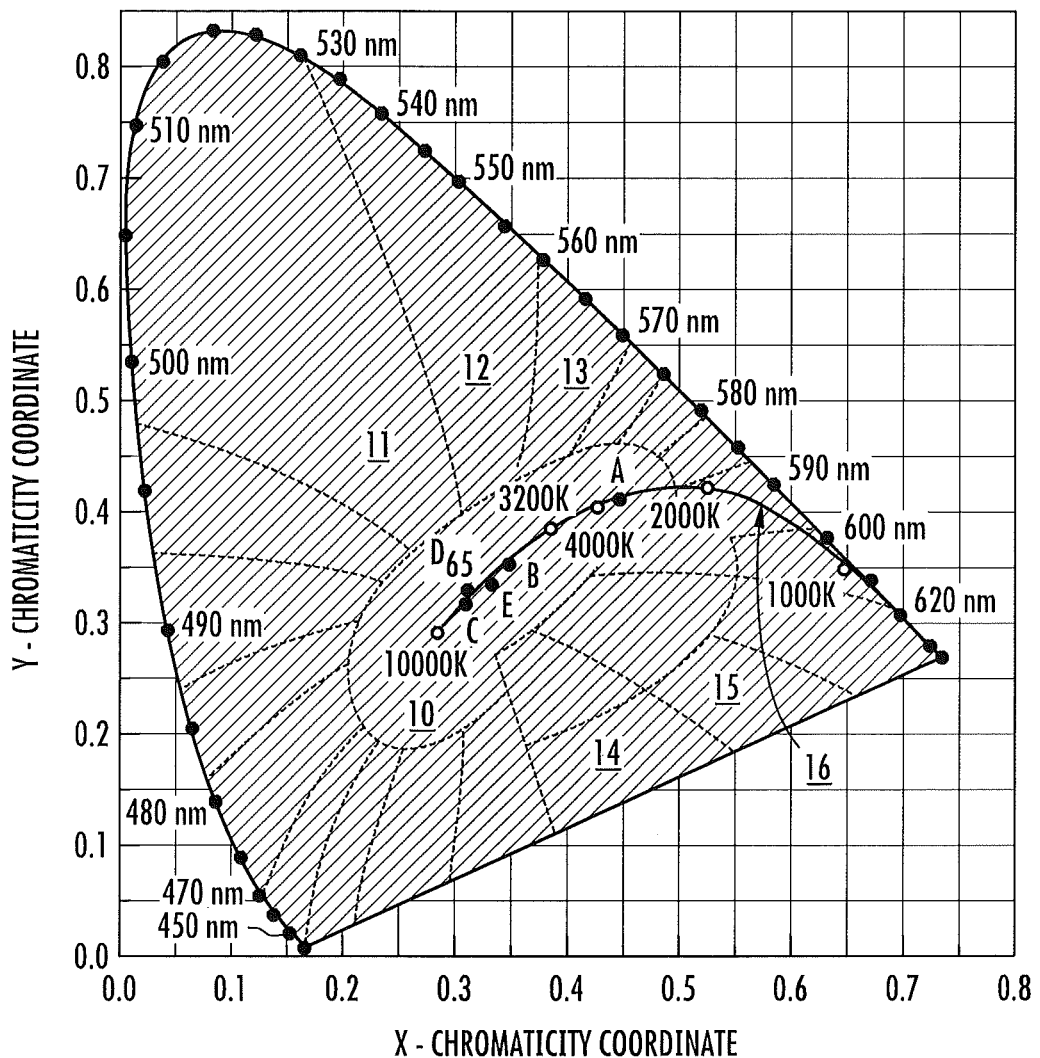
FIG. 1 is a graph of a 1931 CIE Chromaticity Diagram illustrating the location of the planckian locus.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that, when used in this specification, the terms "comprises" and/or "including" and derivatives thereof, specify the presence of stated features, operations, elements, and/or components, but do not preclude the presence or addition of one or more other features, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions and/or layers, these elements, components, regions and/or layers should not be limited by these terms. These terms are only used to distinguish one element, component, region or layer from another element, component, region or layer. Thus, a first element, component, region or layer discussed below could be termed a second element, component, region or layer without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

As used herein, the term "solid state light emitting device" may include a light emitting diode, laser diode and/or other semiconductor device which includes one or more semiconductor layers, which may include silicon, silicon carbide, gallium nitride and/or other semiconductor materials, an optional substrate which may include sapphire, silicon, silicon carbide and/or other microelectronic substrates, and one or more contact layers which may include metal and/or other conductive materials. The design and fabrication of solid state light emitting devices are well known to those skilled in the art. The expression "light emitting device," as used herein, is not limited, except that it be a device that is capable of emitting light.

Figure 10:
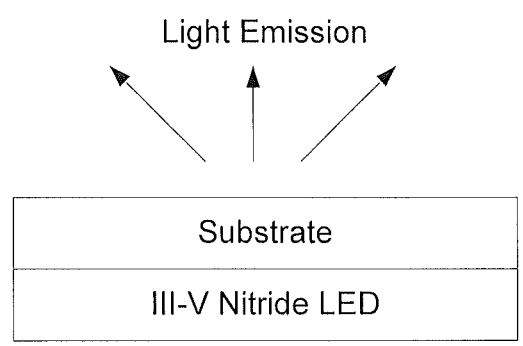
FIG. 10 illustrates a light emitting device according to embodiments of the present invention having a flip-chip orientation in which light emission occurs through the substrate.

Solid state light emitting devices according to embodiments of the invention may include III-V nitride (e.g., gallium nitride) based LEDs or lasers fabricated on a silicon carbide or gallium nitride substrates such as those devices manufactured and sold by Cree, Inc. of Durham, N.C. Such LEDs and/or lasers may (or may not) be configured to operate such that light emission occurs through the substrate in a so-called "flip chip" orientation, as is graphically illustrated in FIG. 10. Solid state light emitting devices according to embodiments of the present invention include both vertical devices with a cathode contact on one side of the chip, and an anode contact on an opposite side of the chip and devices in which both contacts are on the same side of the device. Some embodiments of the present invention may use solid state light emitting devices, device packages, fixtures, luminescent materials/elements, power supplies, control elements, and/or methods such as described in U.S. Pat. Nos. 7,564,180; 7,456, 499; 7,213,940; 7,095,056; 6,958,497; 6,853,010; 6,791,119; 6,600,175, 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/ 0198112; 2008/0179611, 2008/0173884, 2008/0121921; 2008/0012036; 2007/0253209; 2007/0223219; 2007/ 0170447; 2007/0158668; 2007/0139923, and/or 2006/ 0221272, Visible light may include light having many different wavelengths. The apparent color of visible light can be illustrated with reference to a two dimensional chromaticity diagram, such as the 1931 CIE Chromaticity Diagram illustrated in FIG. 1. Chromaticity diagrams provide a useful reference for defining colors as weighted sums of colors.

As shown in FIG. 1, colors on a 1931 CIE Chromaticity Diagram are defined by x and y coordinates (i.e., chromaticity coordinates, or color points) that fall within a generally U-shaped area. Colors on or near the outside of the area are saturated colors composed of light having a single wavelength, or a very small wavelength distribution. Colors on the interior of the area are unsaturated colors that are composed of a mixture of different wavelengths. White light, which can be a mixture of many different wavelengths, is generally found near the middle of the diagram, in the region labeled 10 in FIG. 1. There are many different hues of light that may be considered "white," as evidenced by the size of the region 10. For example, some "white" light, such as light generated by sodium vapor lighting devices, may appear yellowish in color, while other "white" light, such as light generated by some fluorescent lighting devices, may appear more bluish in color.

Light that generally appears green or includes a substantial green component is plotted in the regions 11, 12 and 13 that are above the white region 10, while light below the white region 10 generally appears pink, purple or magenta. For example, light plotted in regions 14 and 15 of FIG. 1 generally appears magenta (i.e., red-purple or purplish red).

It is further known that a binary combination of light from two different light sources may appear to have a different color than either of the two constituent colors. The color of the combined light may depend on the wavelengths and relative intensities of the two light sources. For example, light emitted by a combination of a blue source and a red source may appear purple or magenta to an observer. Similarly, light emitted by a combination of a blue source and a yellow source may appear white to an observer.

Each point in the graph of FIG. 1 is referred to as the "color point" of a light source that emits a light having that color. As shown in FIG. 1 a locus of color points that is referred to as the "black-body" locus 16 exists which corresponds to the location of color points of light emitted by a black-body radiator that is heated to various temperatures. The black-body locus 16 is also referred to as the "planckian" locus because the chromaticity coordinates (i.e., color points) that lie along the black-body locus obey Planck's equation: $E(\lambda)=A\lambda^{-5}/(e^{B/T}-1)$, where E is the emission intensity, $\lambda$ is the emission wavelength, T is the color temperature of the black-body and A and B are constants. Color coordinates that lie on or near the black-body locus 16 yield pleasing white light to a human observer.

As a heated object becomes incandescent, it first glows reddish, then yellowish, then white, and finally bluish, as the wavelength associated with the peak radiation of the black-body radiator becomes progressively shorter with increased temperature. This occurs because the wavelength associated with the peak radiation of the black-body radiator becomes progressively shorter with increased temperature, consistent with the Wien Displacement Law. Illuminants that produce light which is on or near the black-body locus 16 can thus be described in terms of their correlated color temperature (CCT). As used herein, the term "white light" refers to light that is perceived as white, is within 7 MacAdam ellipses of the black-body locus on a 1931 CIE chromaticity diagram, and has a CCT ranging from 2000K to 10,000K. White light with a CCT of 4000K may appear yellowish in color, while white light with a CCT of 8000K or more may appear more bluish in color, and may be referred to as "cool" white light. "Warm" white light may be used to describe white light with a CCT of between about 2500K and 4500K, which is more reddish or yellowish in color. Warm white light is generally a pleasing color to a human observer. Warm white light with a CCT of 2500K to 3300K may be preferred for certain applications.

The ability of a light source to accurately reproduce color in illuminated objects is typically characterized using the color rendering index ("CRI"). The CRI of a light source is a modified average of the relative measurements of how the color rendition of an illumination system compares to that of a reference black-body radiator when illuminating eight reference colors. Thus, the CRI is a relative measure of the shift in surface color of an object when lit by a particular lamp. The CRI equals 100 if the color coordinates of a set of test colors being illuminated by the illumination system are the same as the coordinates of the same test colors being irradiated by the black-body radiator. Daylight generally has a CRI of nearly 100, incandescent bulbs have a CRI of about 95, fluorescent lighting typically has a CRI of about 70 to 85, while monochromatic light sources have a CRI of essentially zero. Light sources for general illumination applications with a CRI of less than 50 are generally considered very poor and are typically only used in applications where economic issues preclude other alternatives. Light sources with a CRI value between 70 and 80 have application for general illumination where the colors of objects are not important. For some general interior illumination, a CRI value of greater than 80 is acceptable. A light source with color coordinates within 4 MacAdam step ellipses of the planckian locus 16 and a CRI value that exceeds 85 is more suitable for general illumination purposes. Light sources with CRI values of more than 90 provide greater color quality.

For backlight, general illumination and various other applications, it is often desirable to provide a lighting source that generates white light having a relatively high CRI, so that objects illuminated by the lighting source may appear to have more natural coloring to the human eye. Accordingly, such lighting sources may typically include an array of solid state lighting devices including red, green and blue light emitting devices. When red, green and blue light emitting devices are energized simultaneously, the resulting combined light may appear white, or nearly white, depending on the relative intensities of the red, green and blue sources. However, even light that is a combination of red, green and blue emitters may have a low CRI, particularly if the emitters generate saturated light, because such light may lack contributions from many visible wavelengths.

According to some embodiments of the present invention, LEDs and other solid state light emitting devices are provided that emit warm white light having high CRI values. Solid state lighting devices according to embodiments of the present invention may emit light having CRI values that exceed 90 and may have a color point that is within 7 MacAdam ellipses of the black-body locus on a 1931 CIE chromaticity diagram and that has a correlated color temperature of between about 2500K and about 4500K. In other embodiments, the solid state lighting devices may emit light having CRI values that exceed 90 and may have a color point that is between 0.385 and 0.485 ccx and 0.380 and 0.435 ccy on the 1931 CIE chromaticity diagram and may have a correlated color temperature of between about 2500K and about 4500K. In some embodiments, the correlated color temperature of between about 2500K and about 3300K. The LEDs according to embodiments of the present invention may achieve these high CRI values and warm white light output with a relatively high luminous flux as compared to conventional single-die LEDs that use a comparable LED and have a comparable color point, as such conventional LEDs typically have either lower CRI values or reduced luminous flux.

The LEDs according to some embodiments of the present invention use certain luminophoric mediums to provide warm white light having the high CRI value. Herein, the term "luminophoric medium" refers to a medium which includes one or more luminescent materials such as, for example, phosphors. A wide variety of luminescent materials are known, with exemplary materials being disclosed in, for example, U.S. Pat. No. 6,600,175 and U.S. Patent Application Publication No. 2009/0184616. In addition to phosphors, other luminescent materials include scintillators, day glow tapes, nano-phosphors, quantum dots, and inks that glow in the visible spectrum upon illumination with (e.g., ultraviolet) light. Exemplary luminophoric mediums include layers that include luminescent materials that are coated on solid state light emitting devices and clear encapsulents (e.g., epoxy-based or silicone-based curable resin) that include luminescent materials that are arranged to partially or fully cover one or more solid state light emitting devices.

Figure 2:
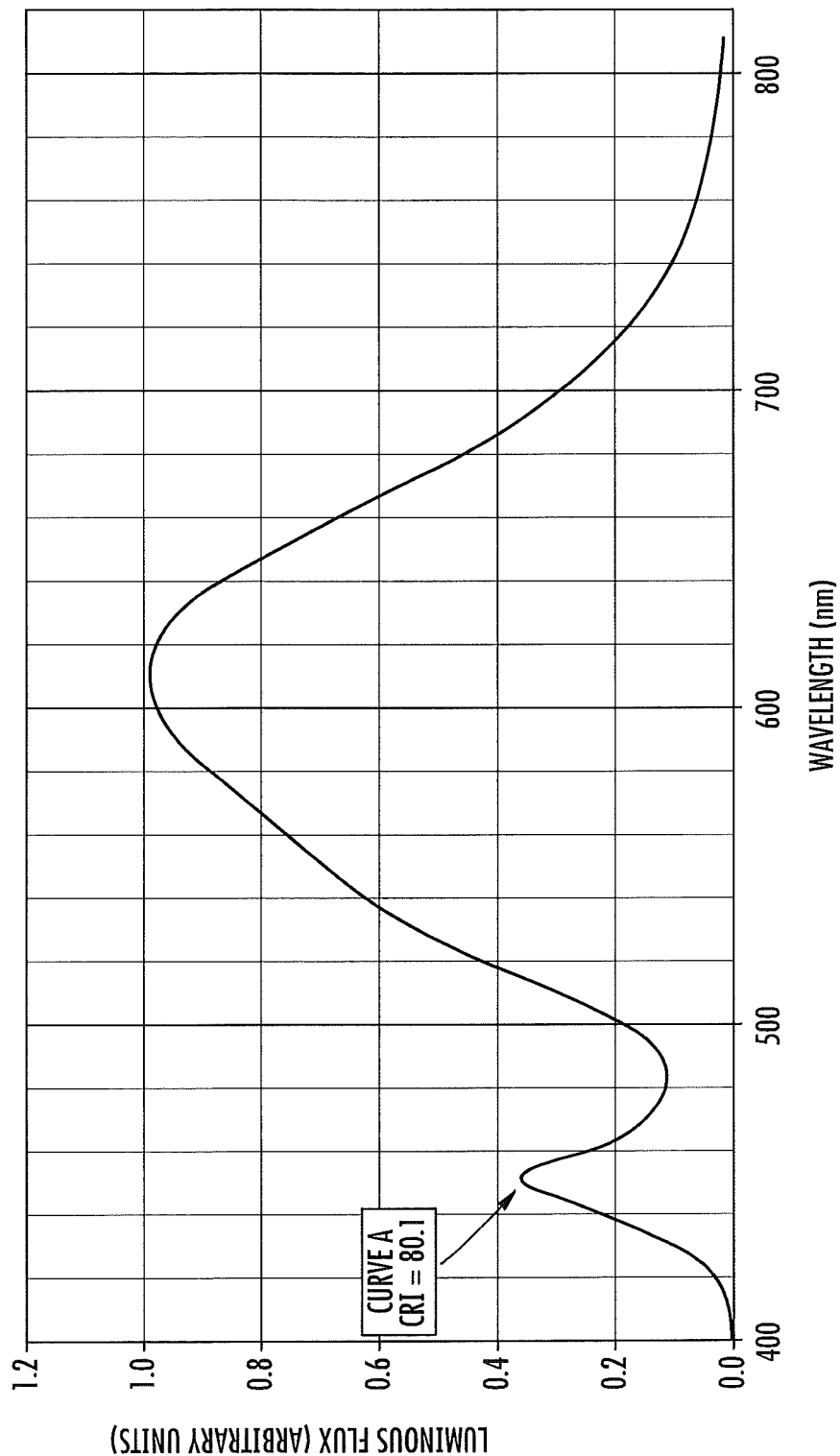
FIG. 2 is a graph illustrating the intensity of the radiation emitted by a conventional warm white solid state lighting device as a function of wavelength.

Currently, single-die solid state lighting devices are available that comprise an LED that emits radiation having a dominant wavelength in the blue color range (e.g., radiation with a dominant wavelength of 465 nanometers). A luminophoric medium is coated or placed on, above and/or around the die, or otherwise arranged to receive the blue light emitted by the LED (herein a luminophoric medium that is arranged to receive the light emitted by a solid state lighting source such as an LED is referred to as a "recipient luminophoric medium"). The recipient luminophoric medium comprises an encapsulant material such as, for example, silicone that has YAG:Ce phosphor particles and $(Ca_{1-x}Sr_x)SiAlN_3:Eu^{2+}$ phosphor particles suspended therein. The YAG:Ce phosphor particles down-convert blue light received from the LED to yellow light, and the $(Ca_{1-x}Sr_x)SiAlN_3:Eu^{2+}$ phosphor particles down-convert the blue light received from the LED to red light. FIG. 2 is a graph illustrating the intensity of the radiation emitted by such a solid state lighting device as a function of wavelength. The exemplary device used to generate the graph of FIG. 2 uses a blue LED having a dominant wavelength of 456 nanometers, and produces a warm white light having a CRI of 80.1. The light from the blue LED that passes through (or around) the luminophoric medium without being down-converted generates the narrow peak in Curve A of FIG. 2 at 456 nanometers. The light from the blue LED that is down-converted by the yellow and red phosphors generates the broad peak in Curve A of FIG. 2 at just over 600 nanometers. Herein, single-die solid state lighting devices that include recipient luminophoric mediums that have a yellow phosphor and a red phosphor such as the device used to generate the graph of FIG. 2 are referred to as yellow/red phosphor devices.

Single-die solid state lighting devices are also currently available that comprise an LED that emits radiation having a dominant wavelength in the blue color range that have a recipient luminophoric silicone encapsulent material that includes phosphor particles that down-convert the blue light received from the LED to green light, and phosphor particles that down-convert the blue light received from the LED to red light. These devices produce a warm white light having a significantly higher CRI value such as, for example, a CRI between 84-94. Herein these devices are referred to as green/red phosphor devices. However, because phosphors that emit light having a peak wavelength in the green color range may be less efficient than various other phosphors, the green/red phosphor devices may have luminous flux values that are significantly lower (e.g., 25-30% or more) than the luminous flux values of a comparable yellow/red phosphor devices.

In order to increase the CRI value of the conventional yellow/red phosphor devices, the dominant wavelength of the blue LED that is included in the devices was increased. In particular, FIG. 3 is a graph illustrating the intensity of the radiation emitted by three different yellow/red phosphor devices, where the only difference between the three devices is the dominant wavelength of the blue LED included therein.

Figure 3:
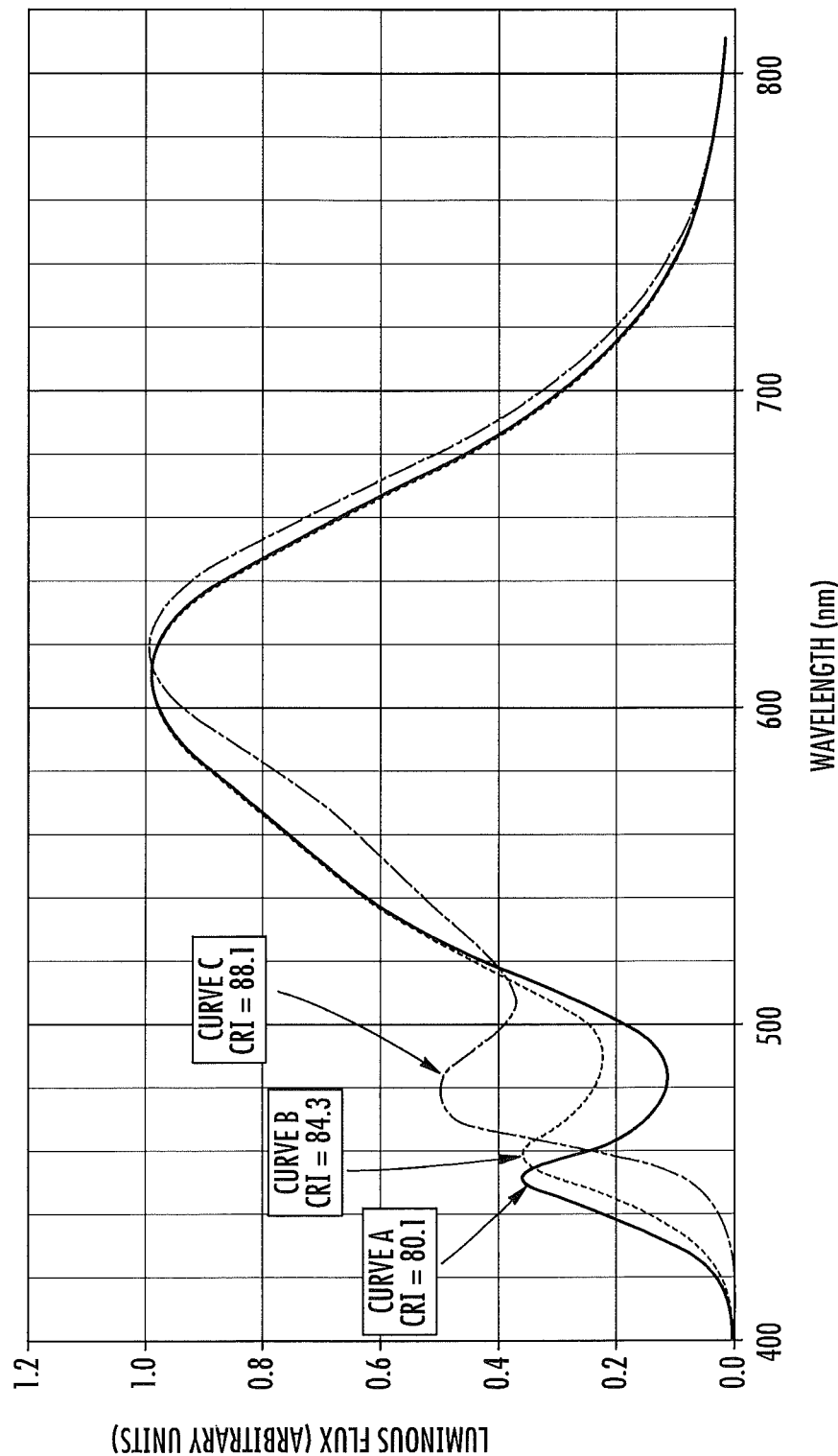
FIG. 3 is a graph illustrating the intensity of the radiation emitted, as a function of wavelength, by three warm white solid state lighting devices that use blue LEDs having different dominant wavelengths.

In FIG. 3, Curve A illustrates the output of a solid state light emitting device that has a blue LED with a dominant wavelength of 456 nanometers (Curve A is identical to Curve A in the graph of FIG. 2). Curve B illustrates the output of a solid state light emitting device that has a blue LED with a dominant wavelength of 464 nanometers, and Curve C illustrates the output of a solid state device that has a blue LED with a dominant wavelength of 472 nanometers. In the devices used to generate Curves A-C, the ratio of the yellow phosphor to the red phosphor was varied so that each of the devices would produce a light having a color that was at approximately the same location on the 1931 CIE Chromaticity Diagram illustrated in FIG. 1. In particular, as the dominant frequency of the light emitted by the blue LED was increased, the ratio of yellow to red phosphors was changed to include more red phosphor and less yellow phosphor. Thus, the recipient luminophoric medium of the device used to generate Curve B had a higher ratio of red-to-yellow phosphors than did the recipient luminophoric medium of the device used to generate Curve A, and the recipient luminophoric medium of the device used to generate Curve C had a higher ratio of red-to-yellow phosphors than did the recipient luminophoric medium of the device used to generate Curve B.

For each of Curves A-C, the y-axis represents the normalized luminous flux of the device, where the luminous flux at each wavelength is graphed as a percentage of the luminous flux at the peak emission wavelength for that particular curve. Accordingly, FIG. 3 shows the relative intensity of the luminous flux as a function of wavelength for each device, but does not illustrate the relative luminous flux values between the three devices.

As shown in Curves A and B of FIG. 3, when the dominant wavelength of the blue LED is increased from 456 nanometers (Curve A) to 464 nanometers (Curve B), the percentage of the luminous flux in the cyan color range (the cyan color range is defined herein as light having a peak wavelength between about 480 nanometers and 500 nanometers) is increased as compared to the device that includes the 456 nanometer blue LED. As is also shown in FIG. 3, this change increased the CRI of the device from 80.1 for the device of Curve A to 84.3 for the device of Curve B.

As shown in Curve C of FIG. 3, when the dominant wavelength of the blue LED is further increased to 472 nanometers, the percentage of the luminous flux in the cyan color range is further increased, as the dominant wavelength of the blue LED is now just outside the cyan color range. Thus, with the device that was used to generate Curve C of FIG. 3, the luminous flux in the cyan range is on the order of half the luminous flux at the peak of the light emitted by the combination of red and yellow phosphors, whereas with the device used to generate Curve A, the luminous flux in the cyan range is on the order of only 10-20% of the luminous flux at the peak of the light emitted by the combination of the red and yellow phosphors. As is further shown in FIG. 3, by further shifting the dominant wavelength of the blue LED to 472 nanometers, the CRI of the device is further increased to 88.1.

While the device of Curve C of FIG. 3 exhibits improved CRI, there are applications where single die warm white LEDs are desired that have CRI values of greater than 90. Pursuant to embodiments of the present invention, single die solid state light emitting devices are provided that emit warm white light and have relatively high CRI values such as, for example, CRI values that may exceed 90.

In some embodiments, these solid state light emitting devices comprise a blue LED that includes a recipient luminophoric medium that has first, second and third phosphors included therein. The first phosphor may down-convert light received from the blue LED to light having a peak wavelength in the green color range. This phosphor may have a sufficiently broad FWHM bandwidth such that its FWHM emission spectra falls into at least part of the cyan color range. In some embodiments, this first phosphor may comprise a LuAG:Ce phosphor (i.e., cerium doped LuAG). LuAG:Ce phosphors may have a peak emission wavelength of between 535 and 545 nanometers, and a FWHM bandwidth of between about 110-115 nanometers. As such, the FWHM bandwidth of LuAG:Ce phosphors may extend throughout the entire cyan color range. The second phosphor may down-convert light received from the blue LED to light having a peak wavelength in the yellow color range. In some embodiments, this second phosphor may comprise a YAG:Ce phosphor. The third phosphor may down-convert light received from the blue LED to light having a peak wavelength in the red color range. In some embodiments, this third phosphor may comprise a $(Ca_{1-x}Sr_x)SiAlN_3:Eu^{2+}$ phosphor.

In some embodiments, the LuAG:Ce phosphor and the YAG:Ce could be grown together in a single cerium-doped structure that includes lutetium, yttrium, aluminum and oxygen. For example, the LuAG:Ce phosphor and the YAG:Ce could be implemented together as a $Lu_{1-x}Y_xAl_5O_{12}:Ce$ material. Such a material would act as both a first phosphor that emits light like a LuAG:Ce phosphor and a second phosphor that emits light like a YAG:Ce phosphor (which would provide a combined spectra having a peak between the peak wavelength of the LuAG:Ce phosphor and the peak wavelength of the YAG:Ce phosphor). Thus, it will be appreciated that the first and second phosphors may comprise two separate phosphors, two separate phosphors that are mixed together, and/or a composition in which both phosphors are grown together in the same structure.

It will also be appreciated that pursuant to some embodiments of the present invention, the first phosphor may comprise a first aluminum garnet-based phosphor, the second phosphor may comprise a second aluminum garnet-based phosphor, and the third phosphor comprises a nitride- or oxynitride-based phosphor. In some of these embodiments, the first phosphor may emit light in the green color range and the second phosphor may emit light in the yellow color range. in some embodiments, the first phosphor may comprise a LuAG:Ce phosphor or may comprise any other aluminum garnet-based phosphor, and the second phosphor may comprise a YAG:Ce or may comprise any other aluminum garnet-based phosphor. The third phosphor may comprise any suitable nitride- or oxynitride-based phosphor, and is not limited to calcium and strontium based nitride- or oxynitride-based phosphors. It will be understood that the use of first and second aluminum garnet-based phosphors may have certain advantages in particular implementations, as the two aluminum garnet-based phosphors may have good compatability when they are, for example, mixed together in a binder, and as aluminum garnet-based phosphors may exhibit good stability and have other desirable features for use in luminophoric mediums.

Figure 4:
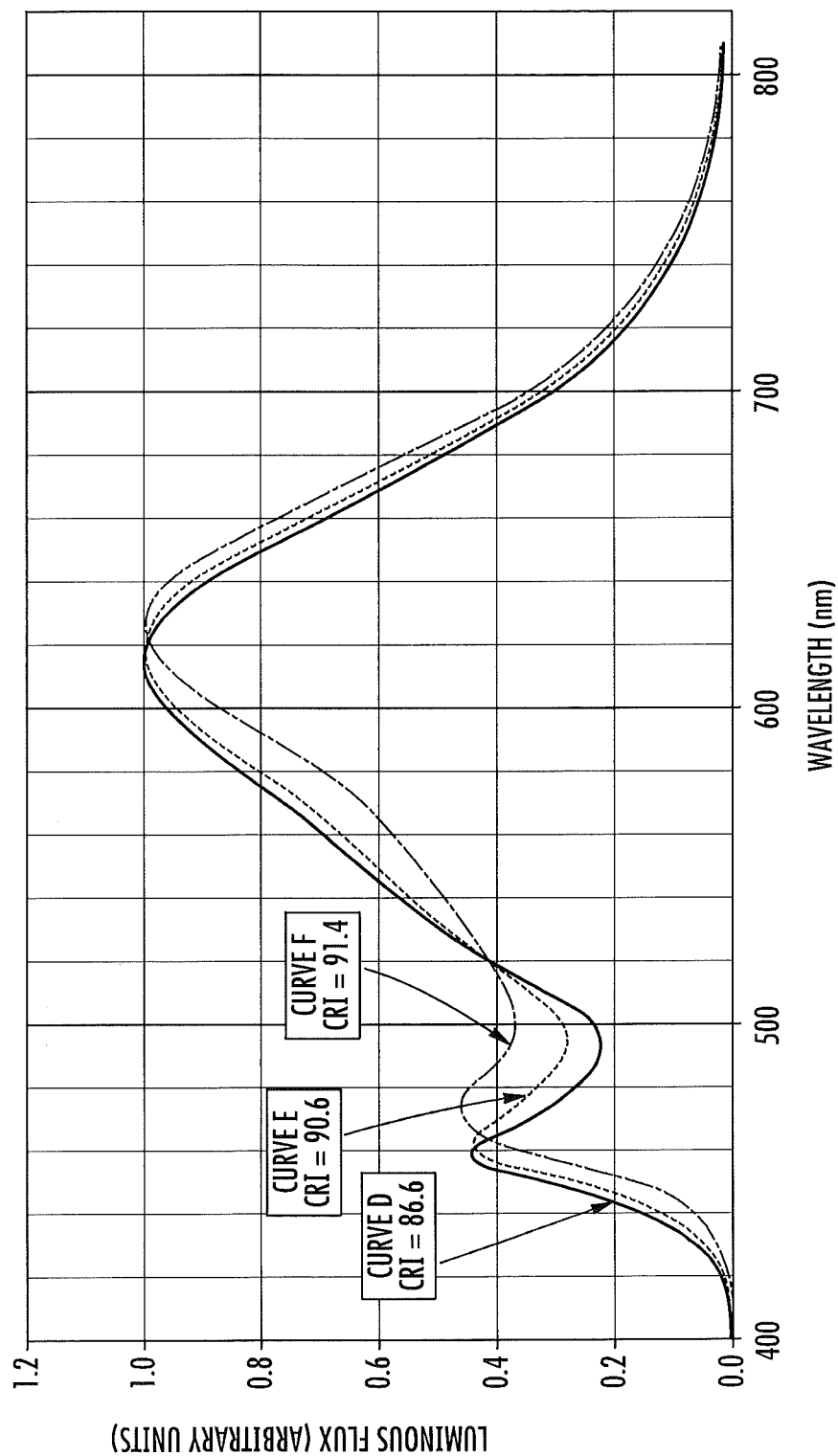
FIG. 4 is a graph illustrating the intensity of the radiation emitted by three different solid state lighting devices according to embodiments of the present invention as a function of the wavelength.

FIG. 4 is a graph illustrating the intensity of the radiation emitted by three different solid state lighting devices according to embodiments of the present invention as a function of the wavelength. In FIG. 4, all of the solid state devices use a blue LED that has a dominant wavelength of 464 nanometers. In the device used to generate Curve D, the light emitting device is a yellow/red phosphor device that includes a recipient luminophoric medium that has a yellow phosphor (YAG:Ce) and a red phosphor $((Ca_{1-x}Sr_x)SiAlN_3:Eu^{2+})$; in the device used to generate Curve E, the LED includes a recipient luminophoric medium that has a green phosphor (LuAG:Ce), a yellow phosphor (YAG:Ce) and a red phosphor $((Ca_{1-x}Sr_x)SiAlN_3:Eu^{2+})$ (herein "a green/yellow/red phosphor device"); and in the device used to generate Curve F, the LED includes a recipient luminophoric medium that has a green phosphor (LuAG:Ce) and a red phosphor $((Ca_{1-x}Sr_x)SiAlN_3:Eu^{2+})$ (herein "a green/red phosphor device").

As shown in Curve D, the yellow/red phosphor device exhibited a CRI value of 86.6. This device was similar to the device used to generate Curve B of FIG. 2, but exhibited the improved CRI because it had a color point at a different location on the 1931 CIE Chromaticity Diagram of FIG. 1. However, the device still has a relatively low percentage of the luminous flux in the cyan color range, and failed to achieve a CRI of greater than 90.

In contrast, the devices of Curves E and F both achieved CRI values of greater than 90. In particular, the green/yellow/red phosphor device that was used to generate Curve E achieved a CRI value of 90.6, and the green/red phosphor device that was used to generate Curve F achieved a CRI value of 91.4. In each case, these devices had an increased percentage of their luminous flux in the cyan color range, which is attributable to the inclusion of the green phosphor that had significant emission in the cyan color range. Curve F also shows that the omission of any yellow phosphor in the device used to generate Curve F shifts the major peak in the spectra (i.e., the peak between 600 and 700 nanometers) to the right (i.e., to higher wavelengths). In the devices used to generate Curves D-F, the ratio of the yellow phosphor to the red phosphor was again varied so that each of the devices would produce a light having a color that was at approximately the same location on the 1931 CIE Chromaticity Diagram illustrated in FIG. 1. This was accomplished by increasing the percentage of red phosphor in the devices that included the green phosphor.

As can be seen from FIG. 4, in the solid state light emitting devices that were used to generate Curves E and F, the inclusion of a green phosphor in the luminophoric medium may help to "fill in" some of the spectral gap in the cyan color range that may be present in light emitted by the conventional yellow/red phosphor devices. As a result, the light emitting devices according to embodiments of the present invention may exhibit high CRI values.

Figure 5A:
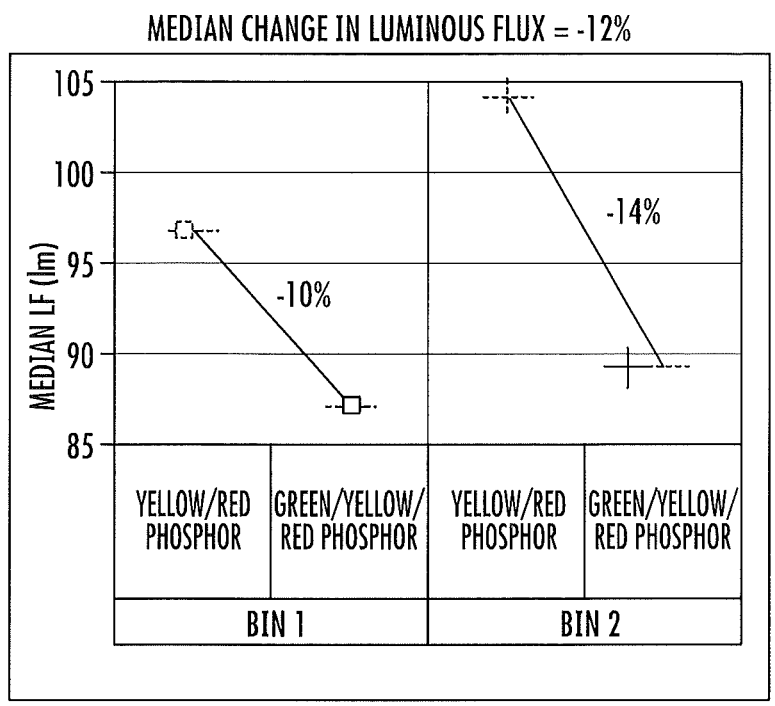
FIG. 5A is a chart that illustrates the median CRI for a plurality of solid state light emitting devices according to embodiments of the present invention as compared to the median CRI for a plurality of conventional solid state light emitting devices.
Figure 5B:
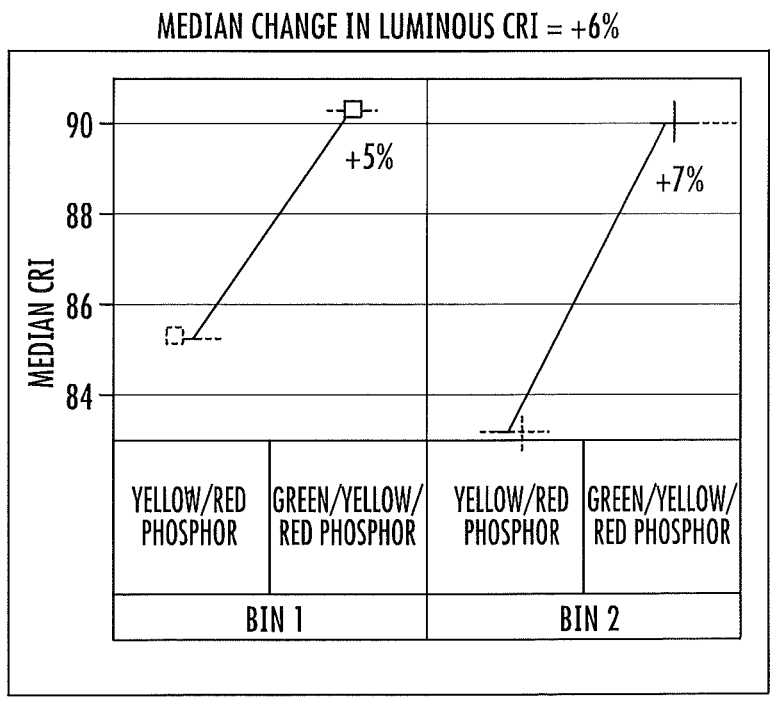
FIG. 5B is a chart that illustrates the median luminous flux for the devices used to generate FIG. 5A.

FIGS. 5A and 5B provide additional data showing how the inclusion of a green phosphor in the luminophoric medium to provide a green/yellow/red phosphor device effects the performance of a device as compared to a conventional yellow/red phosphor device. In particular, FIG. 5A illustrates the median CRI for a plurality of green/yellow/red phosphor devices according to embodiments of the present invention that fall within two different warm white color bins (a color bin refers to a region on the 1931 CIE Chromaticity Diagram) as compared to the median CRI for a plurality of conventional yellow/red phosphor devices that fall within the same two warm white color bins. As shown in FIG. 5A, in the first color bin, the addition of the green phosphor increased the CRI on average by 5% (from 85 to 90), while in the second color bin the addition of the green phosphor increased the CRI on average by 7% (from 83 to 90). Thus, the addition of the green phosphor resulted in an average increase in CRI of 6%.

FIG. 5B illustrates the median luminous flux (in lumens) for the devices used to generate FIG. 5A. As shown in FIG. 5B, the luminous flux of the green/yellow/red phosphor devices that fall within the first warm white color bin is 10% less than the median luminous flux for the yellow/red phosphor devices that fall within the same color bin. With respect to the second color bin, the addition of the green phosphor decreased the luminous flux on average by 14%. Thus, the addition of the green phosphor resulted in an average decrease in luminous flux of about 12%. This decrease in luminous flux is significantly less than the decrease in luminous flux exhibited by conventional green/red phosphor devices, which may be 25-30% or more.

Figure 6A:
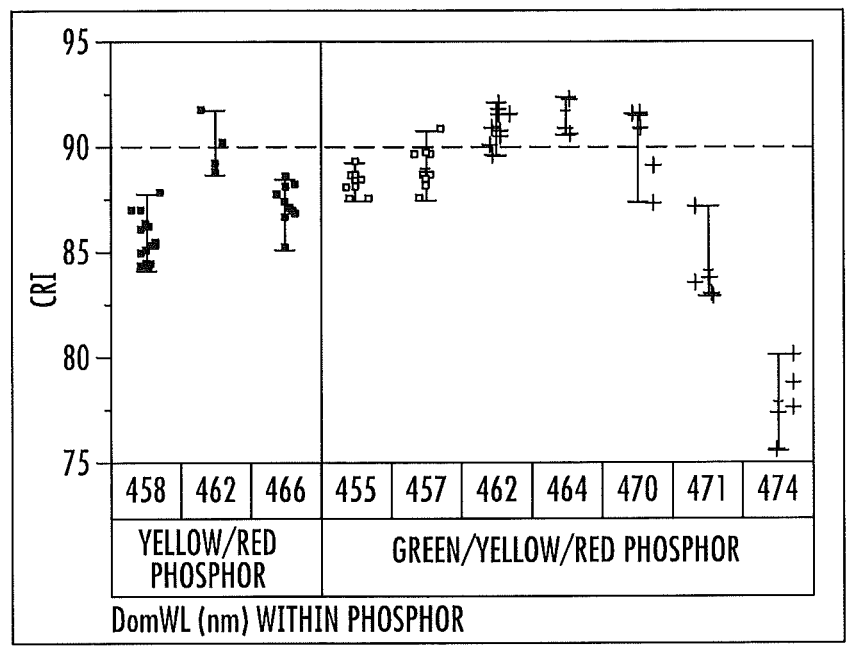
FIG. 6A is a chart that illustrates the measured CRI for a plurality of conventional solid state light emitting devices and for a plurality of solid state light emitting devices according to embodiments of the present invention.
Figure 6B:
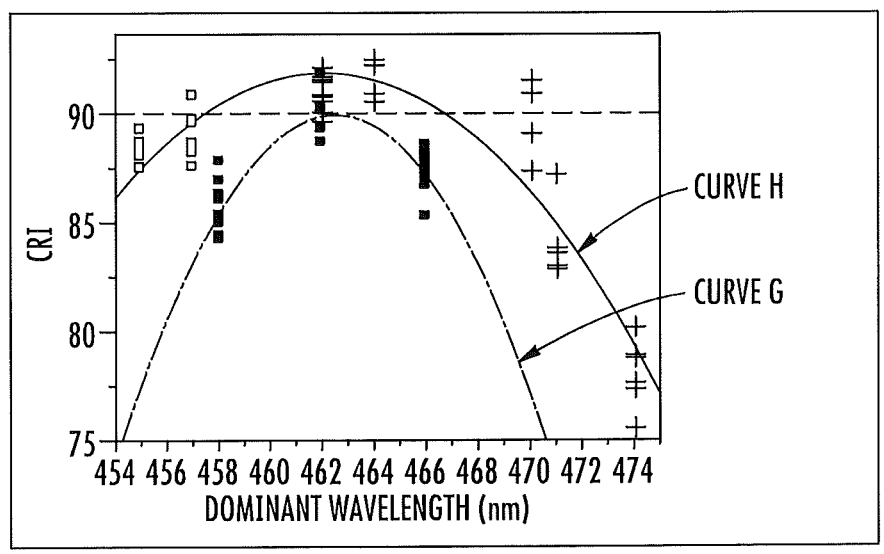
FIG. 6B is a graph of the data from the chart of FIG. 6A.

FIGS. 6A and 6B illustrate the effect of the dominant wavelength of the blue LED on both yellow/red phosphor devices and on green/yellow/red phosphor devices according to embodiments of the present invention. In particular, the chart of FIG. 6A illustrates the measured CRI for a plurality of yellow/red phosphor devices at each of three dominant wavelengths for the blue LED (458, 462 and 466 nanometers), as well as the measured CRI for a plurality of green/yellow/red phosphor devices at each of seven dominant wavelengths for the blue LED (455, 457, 462, 464, 470, 471 and 474 nanometers). FIG. 6B graphically illustrates the data from the chart of FIG. 6A, and provides a curve fit to better illustrate how the CRI values for the yellow/red phosphor devices (Curve G) and for the green/yellow/red phosphor devices (Curve H) vary as a function of the dominant wavelength of the blue LED.

As shown in FIG. 6B, the green/yellow/red phosphor devices generally provide a higher CRI value than do the yellow/red phosphor devices at the same wavelengths. Moreover, the CRI values exhibited by the green/yellow/red phosphor devices fall off more slowly from the peak values than do the CRI values exhibited by the yellow/red phosphor devices. Thus, the solid state lighting devices according to embodiments of the present invention may provide higher CRI values, and may also exhibit acceptable CRI performance over a broader range of dominant wavelengths for the blue LED included in the device.

Figure 7A:
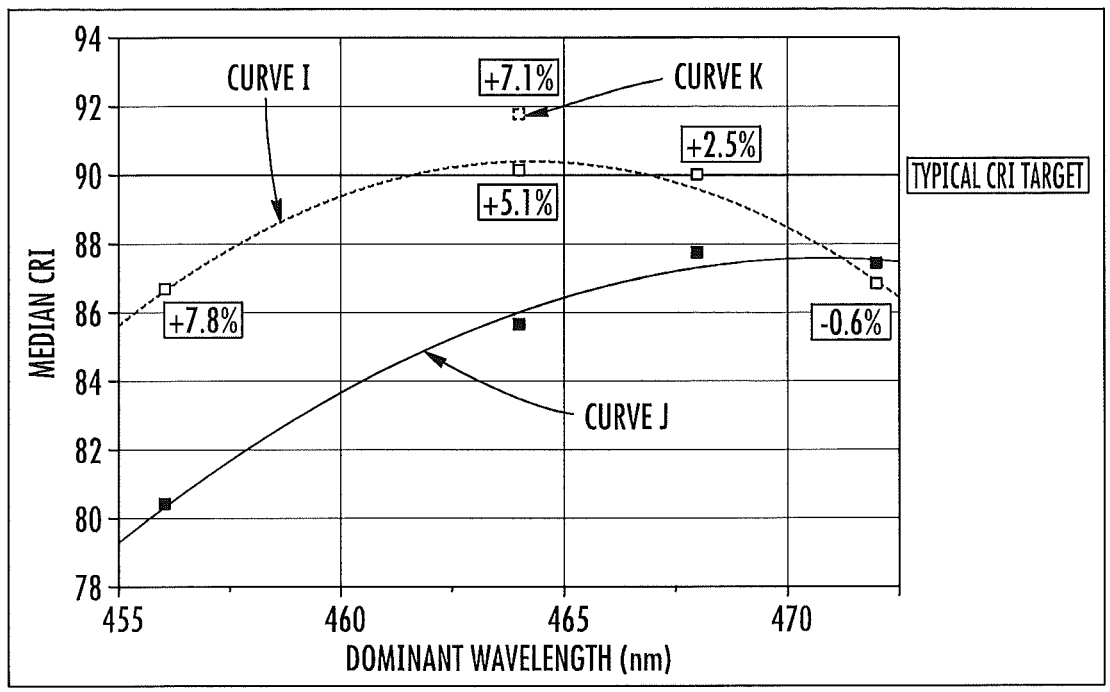
FIG. 7A is a graph that illustrates the median CRI for various solid state light emitting devices as a function of the dominant wavelength of the blue LEDs included in the devices.
Figure 7B:
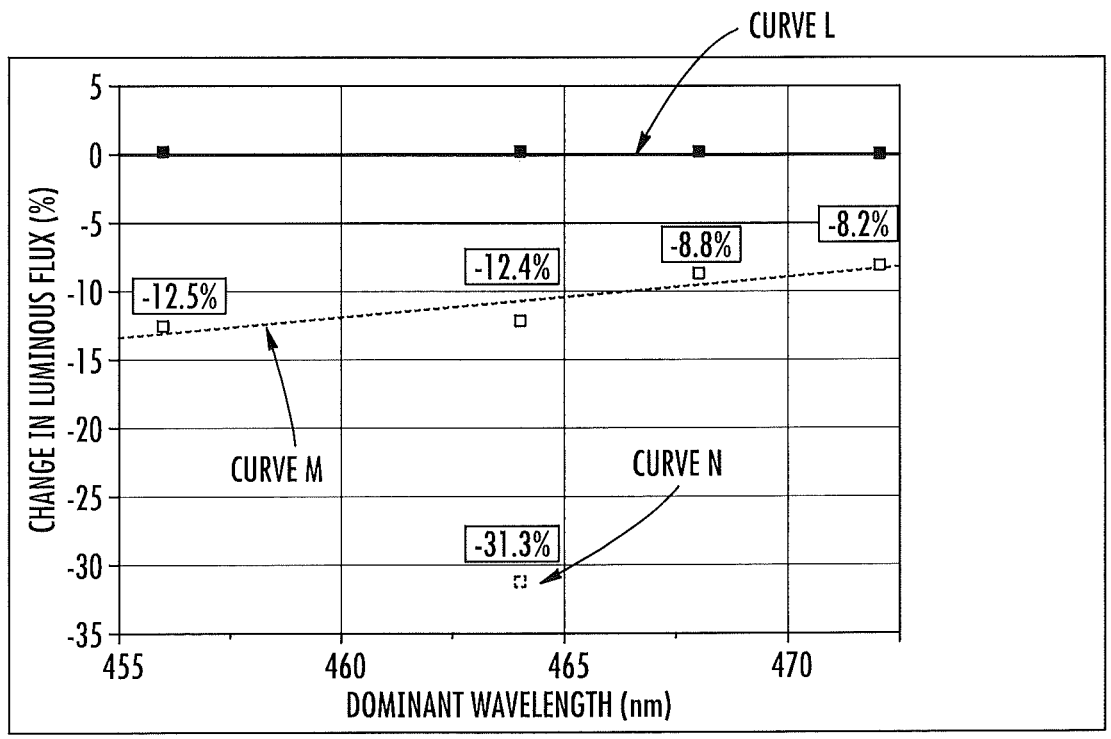
FIG. 7B is a graph that illustrates the luminous flux of the solid state light emitting devices of FIG. 7A as a percentage of the luminous flux of conventional solid state light emitting devices with blue LEDs having the same dominant wavelengths.

FIGS. 7A and 7B are graphs that further illustrate the differences in CRI and luminous flux for green/yellow/red phosphor devices made according to embodiments of the present invention as compared to conventional yellow/red phosphor devices, as a function of the dominant wavelength of the blue LED included in the devices. FIG. 7A illustrates the median CRI values for various devices as a function of the dominant wavelength of the blue LED, while FIG. 7B illustrates the luminous flux of the green/yellow/red phosphor devices as a percentage of the luminous flux of yellow/red phosphor devices with blue LEDs having the same dominant wavelengths.

In particular, Curve I in FIG. 7A illustrates the CRI of the green/yellow/red phosphor devices, while Curve J illustrates the CRI of the conventional yellow/red phosphor devices. As is apparent from FIG. 7A, the green/yellow/red phosphor devices provide higher CRI values for blue LEDs having a dominant wavelength of less than 471 nanometers. The peak CRI is provided at a wavelength of about 464 nanometers, where the CRI value is 5.1% higher than the CRI value conventional yellow/red phosphor devices. The improvement in CRI value is higher at dominant wavelengths less than 464 nanometers (i.e., an improvement of 7.8% at 456 nanometers). FIG. 7A further includes a single data point labeled Curve K, which illustrates the measured CRI value of a green/red phosphor device that used a blue LED with a dominant wavelength of 464 nanometers. As shown in FIG. 7A, this device exhibits an even higher CRI value of nearly 92, that is 7.1% greater than the CRI value of the yellow/red phosphor device having a blue LED with a dominant wavelength at 464 nanometers.

Turning now to FIG. 7B, Curve L illustrates the luminous flux (in lumens) of several conventional yellow/red phosphor devices. All of these luminous flux values have been normalized to 0. Curve M illustrates the luminous flux (in lumens) of several green/yellow/red phosphor devices, where the luminous flux value is graphed as the percentage change from the luminous flux value of the yellow/red phosphor device having a blue LED at the same dominant wavelength. As shown in FIG. 7A, the green/yellow/red phosphor devices provide decreased luminous flux as compared to the yellow/red phosphor devices. The decrease in luminous flux is greater the lower the dominant wavelength of the blue LED (i.e., the decrease in luminous flux as compared to a comparable yellow/red phosphor device is 8.2% for a blue LED with a dominant wavelength of 472 nanometers, while the decrease in luminous flux as compared to a comparable yellow/red phosphor device is 12.5% for a blue LED with a dominant wavelength of 456 nanometers). FIG. 7B further includes a single data point labeled Curve N, which illustrates the normalized luminous flux of a green/red phosphor device that used a blue LED with a dominant wavelength of 464 nanometers. As shown in FIG. 7B, this device exhibits a significant loss in luminous flux of 31.3% as compared to the conventional yellow/red phosphor devices. Thus, while the green/yellow/red phosphor devices according to embodiments of the present invention do exhibit a loss in luminous flux as compared to the conventional yellow/red phosphor devices, this loss is only on the order of 8-12%, whereas comparative loss in luminous flux exhibited by either conventional green/red phosphor devices and the green/red phosphor device of Curve N are on the order of two or more time higher.

As noted above, in some embodiments, the recipient luminophoric medium may include a LuAG:Ce phosphor that emits light having a peak frequency between 535 nanometers and 545 nanometers and a FWHM of 110-115 nanometers, which is primarily in the green color range, a YAG:Ce phosphor that emits light having a peak frequency between 545 nanometers and 565 nanometers and a FWHM of 115-120 nanometers, which is primarily in the yellow color range, and a $(Ca_{1-x}Sr_x)SiAlN_3:Eu^{2+}$ phosphor that emits light having a peak frequency between 630 nanometers and 650 nanometers and a FWHM of 85-95 nanometers, which is primarily in the red color range. In some embodiments, the ratio of LuAG:Ce phosphor to YAG:Ce phosphor may be between about 3-to-1 and 1-to-3 by weight. In a more specific embodiment, the ratio of LuAG:Ce phosphor to YAG:Ce phosphor may be between about 1.5-to-1 and 1-to-1.5 by weight. In some embodiments, the ratio of the combination of the LuAG:Ce phosphor and the YAG:Ce phosphor to the red phosphor may be between about 1-to-1 and 9-to-1 by weight.

In some embodiments of the present invention, light emitting devices are provided that include a solid state lighting source such as, for example, a blue or ultraviolet LED, and a recipient luminophoric medium for down-converting at least some of the radiation emitted by the solid state lighting source. The luminophoric medium may include a material such as a first phosphor that down-converts the radiation emitted by the solid state lighting source to radiation having a peak wavelength in the green color range that has a FWHM bandwidth that extends into the cyan color range, and one or more additional materials that down-convert the radiation emitted by the solid state lighting source to radiation having a peak wavelength in another color range.

In some embodiments, the first phosphor may down-convert the radiation emitted by the solid state lighting source to a radiation having a peak wavelength between 525 nanometers and 550 nanometers, and has a FWHM emission bandwidth that extends below 500 nanometer. In some embodiments, the one or more additional materials may be second and third phosphors that together down-convert the radiation emitted by the solid state lighting source to radiation having a peak wavelength greater than 580 nanometers. In some embodiments, the second phosphor may down-convert the radiation emitted by the solid state lighting source to radiation having a peak wavelength in the yellow color range, and the third phosphor may down-convert the radiation emitted by the solid state lighting source to radiation having a peak wavelength in the red color range. The first phosphor may be a LuAG:Ce phosphor, the second phosphor may be a YAG:Ce phosphor, and the third phosphor may be a $(Ca_{1-x}Sr_x)SiAlN_3$:$Eu^{2+}$ phosphor. Such a light emitting device may emit a warm white light having a correlated color temperature between about 2500K and 4500K, a CRI value of at least 90, and a color point that is within 7 MacAdam ellipses of the blackbody locus on a 1931 CIE chromaticity diagram. In some embodiments, the correlated color temperature may be between about 2500K and 3300K.

In further embodiments of the present invention, light emitting devices are provided that include an LED that emits light having a dominant wavelength in the blue color range, and a recipient luminophoric medium that is configured to down-convert at least some of the light emitted by the LED. The recipient luminophoric medium may include at least a first phosphor that down-converts the radiation emitted by the LED to radiation having a peak wavelength in the green color range, a second phosphor that down-converts the radiation emitted by the LED to radiation having a peak wavelength in a second color range having wavelengths above the green color range, and a third phosphor that down-converts the radiation emitted by the LED to radiation having a peak wavelength in a third color range having wavelengths above the green color range. The first phosphor may have a FWHM emission bandwidth that extends into the cyan color range.

In some embodiments, the phosphors included in the recipient luminophoric medium and the LED are configured to together emit warm white light having a correlated color temperature between about 2500K and 4500K (or even between about 2500K and 3300K) and/or having a CRI of at least 90. In some embodiments, the second phosphor down-converts the radiation emitted by the LED to radiation having a peak wavelength in the yellow color range, and the third phosphor down-converts the radiation emitted by the LED to radiation having a peak wavelength in the red color range. The first phosphor may comprise a LuAG:Ce phosphor, the second phosphor comprises a YAG:Ce phosphor, and the third phosphor comprises a $(Ca_{1-x}Sr_x)SiAlN_3$:$Eu^{2+}$ phosphor.

In still further embodiments, light emitting devices are provided that include a LED that emits light having a dominant wavelength in the blue color range and a recipient luminophoric medium that is configured to down-convert at least some of the light emitted by the LED. The recipient luminophoric medium includes a first material that down-converts the radiation emitted by the LED to radiation having a peak wavelength in the green color range and a second material that down-converts the radiation emitted by the LED to radiation having a peak wavelength in a second color range having wavelengths above the green color range. The spectra emitted by the light emitting device has two distinct peaks in the visible spectrum, including a first peak in the blue color range, a second peak at wavelengths longer than the wavelengths associated with the green color range.

In some embodiments, the first material may be a first phosphor such as, for example, a LuAG:Ce phosphor, that down-converts the radiation emitted by the LED to radiation having a peak wavelength in the green color range and that as a FWHM emission bandwidth that extends into the cyan color range, and the second material may be a second phosphor such as, for example, aYAG:Ce phosphor, that down-converts the radiation emitted by the LED to a radiation having a peak wavelength in the yellow color range and a third phosphor such as, for example, $(Ca_{1-x}Sr_x)SiAlN_3$:$Eu^{2+}$ phosphor, which down-converts the radiation emitted by the LED to a radiation having a peak wavelength in the red color range. The LED may emit a warm white light having a correlated color temperature between about 2500K and 4500K (or even between about 2500K and 3300K) and a CRI value of at least 90.

In some embodiments, the LED (or other solid state light emitting device) may emit light having a dominant frequency between about 430 nanometers to 470 nanometers. The first phosphor may emit light having a peak frequency between about 525 nanometers to 545 nanometers. The second phosphor may emit light having a peak frequency between about 545 nanometers to 585 nanometers. The third phosphor may emit light having a peak frequency between about 600 nanometers to 650 nanometers.

The phosphor particles for the green, yellow and red phosphors may range in diameter (the term diameter is used loosely, as the particles will not necessarily have a spherical shape) may range from about 1 micron to about 30 microns, with about half of the particles being from between about 4 microns to about 20 microns. In some embodiments, at least half of the particles of the green, yellow and red phosphors may have a size (diameter) in the range between 2 microns and 20 microns.

Figure 8A:
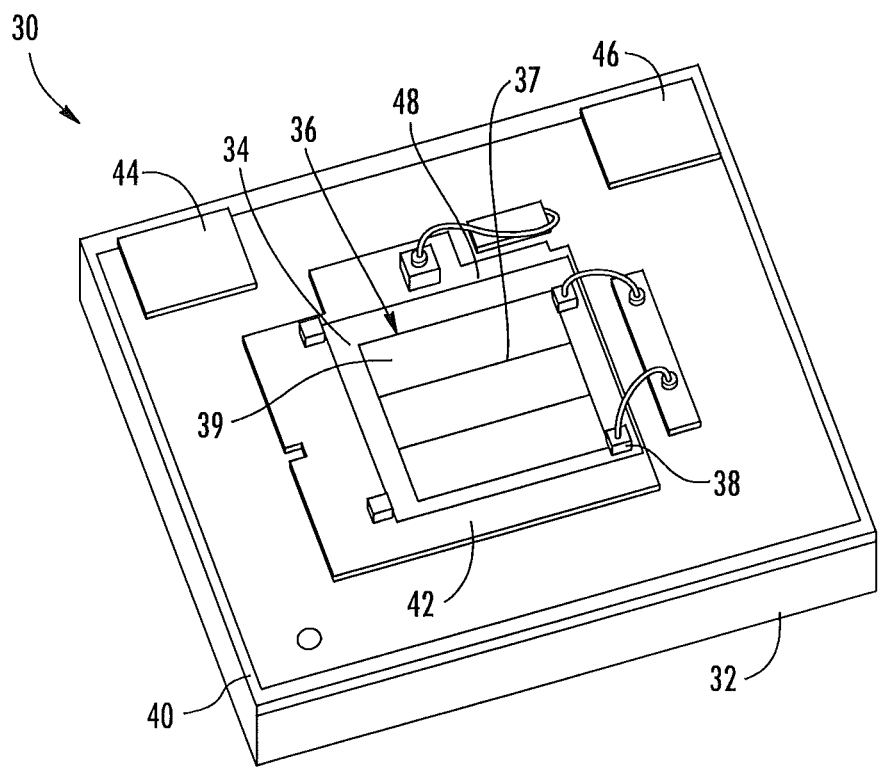
FIGS. 8A-8D are various views of a solid state light emitting device according to embodiments of the present invention.
Figure 8B:
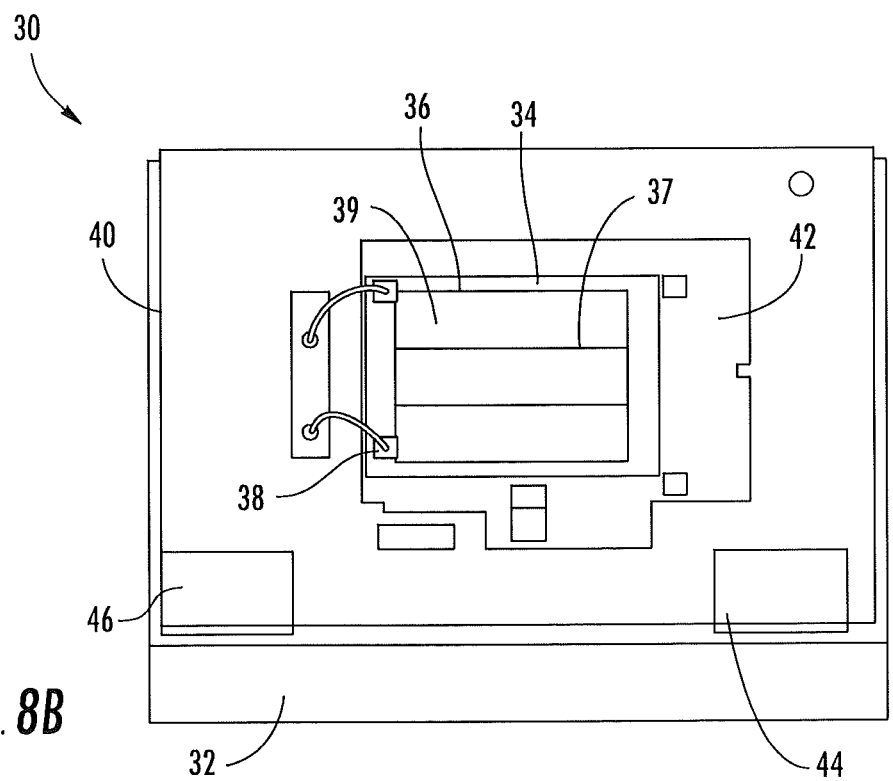
Figure 8C:
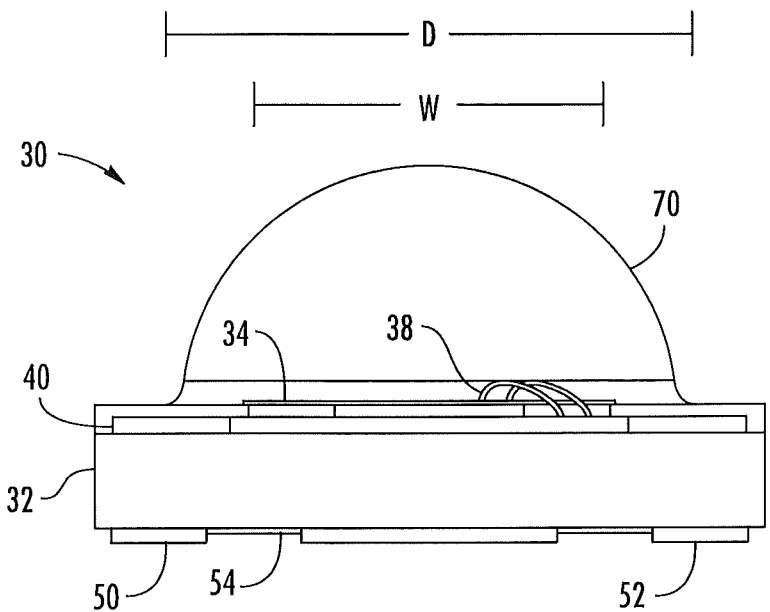
Figure 8D:
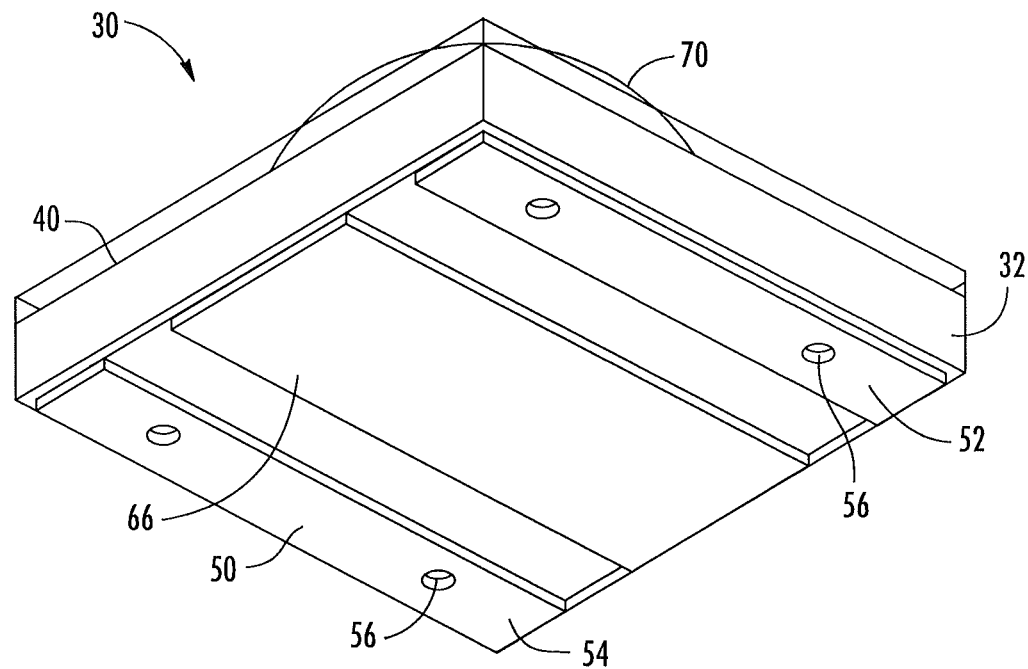

A solid state light emitting device 30 will now be descried that includes a luminophoric medium according to embodiments of the present invention with reference to FIGS. 8A-8D. The solid state light emitting device 30 comprises a packaged LED. In particular, FIG. 8A is a perspective view of the solid state light emitting device 30 without a lens thereof. FIG. 8B is a perspective view of the device 30 viewed from the opposite side. FIG. 8C is a side view of the device 30 with a lens covering the LED chip. FIG. 8D is a bottom perspective view of the device 30.

As shown in FIG. 8A, the solid state light emitting device 30 includes a substrate/submount ("submount") 32 on which a single LED chip or "die" 34 is mounted. The submount 32 can be formed of many different materials such as, for example, aluminum oxide, aluminum nitride, organic insulators, a printed circuit board (PCB), sapphire or silicon. The LED 34 can have many different semiconductor layers arranged in different ways. LED structures and their fabrication and operation are generally known in the art and hence are only briefly discussed herein. The layers of the LED 34 can be fabricated using known processes such as, for example, metal organic chemical vapor deposition (MOCVD). The layers of the LED 34 may include at least one active layer/region sandwiched between first and second oppositely doped epitaxial layers all of which are formed successively on a growth substrate. Typically, many LEDs are grown on a growth substrate such as, for example, a sapphire, silicon carbide, aluminum nitride (AlN), or gallium nitride (GaN) substrate to provide a grown semiconductor wafer, and this wafer may then be singulated into individual LED dies, which are mounted in a package to provide individual packaged LEDs. The growth substrate can remain as part of the final singulated LED or, alternatively, the growth substrate can be fully or partially removed. In embodiments where the growth substrate remains, it can be shaped and/or textured to enhance light extraction.

It is also understood that additional layers and elements can also be included in the LED 34, including but not limited to buffer, nucleation, contact and current spreading layers as well as light extraction layers and elements. It is also understood that the oppositely doped layers can comprise multiple layers and sub-layers, as well as super lattice structures and interlayers. The active region can comprise, for example, a single quantum well (SQW), multiple quantum well (MQW), double heterostructure or super lattice structure. The active region and doped layers may be fabricated from different material systems, including, for example, Group-III nitride based material systems such as GaN, aluminum gallium nitride (AlGaN), indium gallium nitride (InGaN) and/or aluminum indium gallium nitride (AlInGaN). In some embodiments, the doped layers are GaN and/or AlGaN layers, and the active region is an InGaN layer.

The LED 34 may be an ultraviolet, violet or blue LED that emits radiation with a dominant wavelength in a range of about 380 to about 475 nm.

The LED 34 may include a conductive current spreading structure 36 on its top surface, as well as one or more contacts 38 that are accessible at its top surface for wire bonding. The spreading structure 36 and contacts 38 can both be made of a conductive material such as Au, Cu, Ni, In, Al, Ag or combinations thereof, conducting oxides and transparent conducting oxides. The current spreading structure 36 may comprise conductive fingers 37 that are arranged in a pattern on the LED 34 with the fingers spaced to enhance current spreading from the contacts 38 into the top surface of the LED 34. In operation, an electrical signal is applied to the contacts 38 through a wire bond as described below, and the electrical signal spreads through the fingers 37 of the current spreading structure 36 into the LED 34. Current spreading structures are often used in LEDs where the top surface is p-type, but can also be used for n-type materials.

The LED 34 may be coated with a luminophoric medium 39 according to embodiments of the present invention. As discussed above, this recipient luminophoric medium 39 may include multiple phosphors (or other luminescent materials) that absorb at least some of the LED light and emit a different wavelength of light such that the LED emits a combination of light from the LED and the phosphors. In some embodiments, the recipient luminophoric medium 39 includes particles of a green phosphor, particles of a yellow phosphor and particles of a red phosphor mixed therein (together and/or in separate layers). It will be understood that the recipient luminophoric medium 39 may comprise any of the recipient luminophoric mediums discussed in the present disclosure.

The recipient luminophoric medium 39 may be coated on the LED 34 using many different methods, with suitable methods being described in U.S. patent application Ser. Nos. 11/656,759 and 11/899,790, both entitled Wafer Level Phosphor Coating Method and Devices Fabricated Utilizing Method. Alternatively the recipient luminophoric medium 39 may be coated on the LED 34 using other methods such an electrophoretic deposition (EPD), with a suitable EPD method described in U.S. patent application Ser. No. 11/473,089 entitled Close Loop Electrophoretic Deposition of Semiconductor Devices. One exemplary method of coating the recipient luminophoric medium 39 onto the LED 34 is described herein with reference to FIGS. 9A-9E.

An optical element or lens 70 (see FIGS. 8C-8D) is formed on the top surface 40 of the submount 32, over the LED 34, to provide both environmental and/or mechanical protection. The lens 70 can be molded using different molding techniques such as those described in U.S. patent application Ser. No. 11/982,275 entitled Light Emitting Diode Package and Method for Fabricating Same. The lens 70 can be many different shapes such as, for example, hemispheric. Many different materials can be used for the lens 70 such as silicones, plastics, epoxies or glass. The lens 70 can also be textured to improve light extraction and/or scattering particles. In some embodiments, the lens 70 may comprise the recipient luminophoric medium 39 and/or may be used to hold a luminophoric medium 39 in place over the LED 34 instead of and/or in addition to coating a luminophoric medium 39 directly onto the LED chip 34.

The solid state light emitting device 30 may comprise an LED package having different sizes or footprints. In some embodiments, the surface area of the LED chip 34 may cover more than 10% or even 15% of the surface area of the submount 32. In some embodiments, the ratio of the width W of the LED chip 34 to the diameter D (or width D, for square lens) of the lens 70 may be greater than 0.5. For example, in some embodiments, the solid state light emitting device 30 may comprise an LED package having a submount 32 that is approximately 3.45 mm square and a hemispherical lens having a maximum diameter of approximately 2.55 mm. The LED package may be arranged to hold an LED chip that is approximately 1.4 mm square. In this embodiment, the surface area of the LED chip 34 covers more than 16% of the surface area of the submount 32.

The top surface 40 of the submount 32 may have patterned conductive features that can include a die attach pad 42 with an integral first contact pad 44. A second contact pad 46 is also included on the top surface 40 of the submount 32 with the LED 34 mounted approximately at the center of the attach pad 42. The attach pad 42 and first and second contact pads 44, 46 may comprise metals or other conductive materials such as, for example, copper. The copper pads 42, 44, 46 may be plated onto a copper seed layer that is, in turn, formed on a titanium adhesion layer. The pads 42, 44, 46 may be patterned using standard lithographic processes. These patterned conductive features provide conductive paths for electrical connection to the LED 34 using known contacting methods. The LED 34 can be mounted to the attach pad 42 using known methods and materials.

A gap 48 (see FIG. 8A) is included between the second contact pad 46 and the attach pad 42 down to the surface of the submount 32. An electrical signal is applied to the LED 34 through the second pad 46 and the first pad 44, with the electrical signal on the first pad 44 passing directly to the LED 34 through the attach pad 42 and the signal from the second pad 46 passing into the LED 34 through wire bonds. The gap 48 provides electrical isolation between the second pad 46 and attach pad 42 to prevent shorting of the signal applied to the LED 34.

Referring to FIGS. 8C and 8D, an electrical signal can be applied to the package 30 by providing external electrical contact to the first and second contact pads 44, 46 via first and second surface mount pads 50, 52 that are formed on the back surface 54 of the submount 32 to be at least partially in alignment with the first and second contact pads 44, 46, respectfully. Electrically conductive vias 56 are formed through the submount 32 between the first mounting pad 50 and the first contact pad 44, such that a signal that is applied to the first mounting pad 50 is conducted to first contact pad 44. Similarly, conductive vias 56 are formed between the second mounting pad 52 and second contact pad 46 to conduct an electrical signal between the two. The first and second mounting pads 50, 52 allow for surface mounting of the LED package 30 with the electrical signal to be applied to the LED 34 applied across the first and second mounting pads 50, 52.

The pads 42, 44, 46 provide extending thermally conductive paths to conduct heat away from the LED 34. The attach pad 42 covers more of the surface of the submount 32 than the LED 34, with the attach pad extending from the edges of the LED 34 toward the edges of the submount 32. The contact pads 44, 46 also cover the surface of the submount 32 between the vias 56 and the edges of the submount 32. By extending the pads 42, 44, 46, the heat spreading from the LED 34 may be improved, which may improve the operating life of the LED and/or allow for higher operating power.

The LED package 30 further comprises a metalized area 66 on the back surface 54 of the submount 32, between the first and second mounting pads 50, 52. The metalized area 66 may be made of a heat conductive material and may be in at least partial vertical alignment with the LED 34. In some embodiments, the metalized area 66 is not in electrical contact with the elements on top surface of the submount 32 or the first and second mounting pads 50, 52 on the back surface of the submount 32. Although heat from the LED is spread over the top surface 40 of the submount 32 by the attach pad 42 and the pads 44, 46, more heat will pass into the submount 32 directly below and around the LED 34. The metalized area 66 can assist with this dissipation by allowing this heat to spread into the metalized area 66 where it can dissipate more readily. The heat can also conduct from the top surface 40 of the submount 32, through the vias 56, where the heat can spread into the first and second mounting pads 50, 52 where it can also dissipate.

It will be appreciated that FIGS. 8A-8D illustrate one exemplary packaged LED that may include recipient luminophoric mediums according to embodiments of the present invention. Additional exemplary packaged LEDs are disclosed in, for example, U.S. Provisional Patent Application No. 61/173,550, filed Apr. 28, 2009, the entire contents of which are incorporated by reference herein as if set forth in its entirety. It will likewise be appreciated that the recipient luminophoric mediums according to embodiments of the present invention may be used with any other packaged LED structures.

As noted above, in some embodiments, the recipient luminophoric mediums according to embodiments of the present invention may be directly coated onto a surface of a semiconductor wafer before the wafer is singulated into individual LED chips. One such process for applying the recipient luminophoric medium will now be discussed with respect to FIGS. 9A-9E. In the example of FIGS. 9A-9E, the recipient luminophoric medium is coated onto a plurality of LED chips 110. In this embodiment, each LED chip 110 is a vertically-structured device that has a top contact 124 and a bottom contact 122.

Figure 9A:
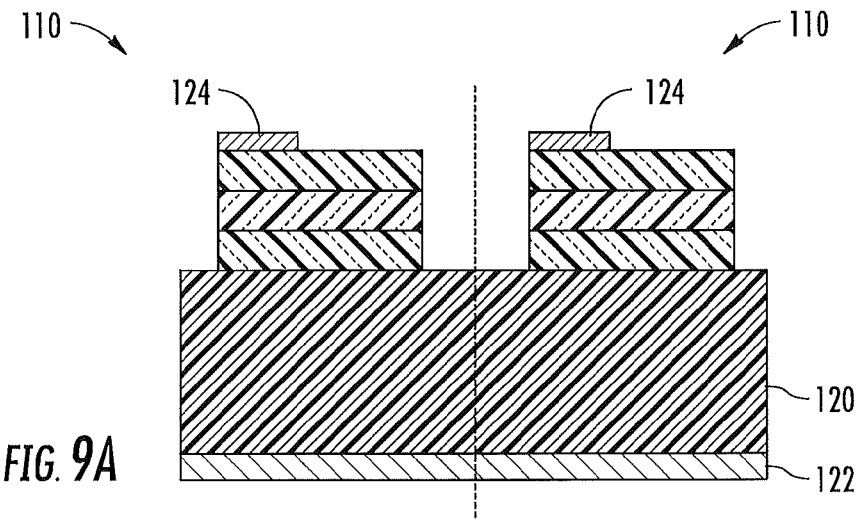
FIGS. 9A-9E are sectional views illustrating fabrication steps that may be used to apply a luminophoric medium to an LED chip wafer according to embodiments of the present invention.

Referring to FIG. 9A, a plurality of LED chips 110 (only two are shown) are shown at a wafer level of their fabrication process (i.e., before the wafer has been separated/singulated into individual LED chips). Each of the LED chips 110 comprises a semiconductor LED that is formed on a substrate 120. Each of the LED chips 110 has first and second contacts 122, 124. The first contact 122 is on the bottom of the substrate 120 and the second contact 124 is on the top of the LED chip 110. In this particular embodiment, the top contact 124 is a p-type contact and the contact 122 on the bottom of the substrate 120 is an n-type contact. However, it will be appreciated that in other embodiments, the contacts 122, 124 may be arranged differently. For example, in some embodiments, both the contact 122 and the contact 124 may be formed on an upper surface of the LED chip 110.

Figure 9B:
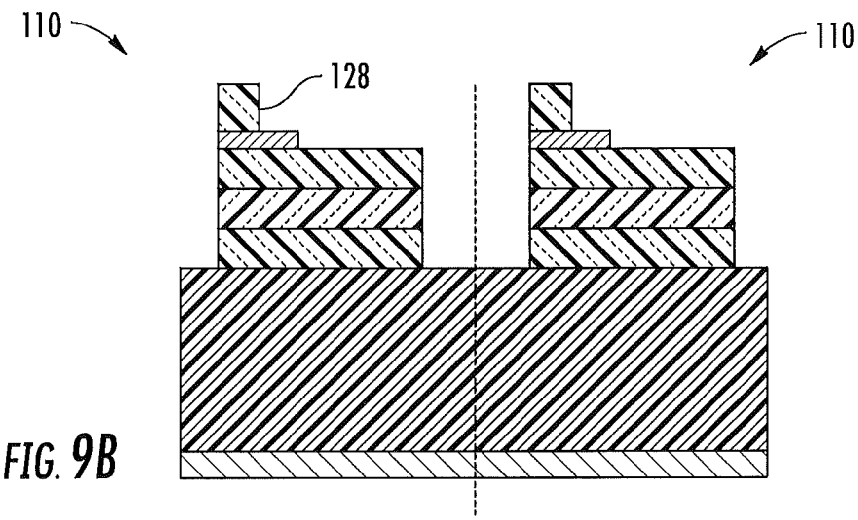

As shown in FIG. 9B, a conductive contact pedestal 128 is formed on the top contact 124 that is utilized to make electrical contact to the p-type contact 124 after the LED chips 110 are coated with a luminophoric medium. The pedestal 128 can be formed of many different electrically conductive materials and can be formed using many different known physical or chemical deposition processes such as electroplating, mask deposition (e-beam, sputtering), electroless plating, or stud bumping. The height of the pedestal 128 can vary depending on the desired thickness of the luminophoric medium and should be high enough to match or extend above the top surface of the luminophoric medium coating from the LED.

Figure 9C:
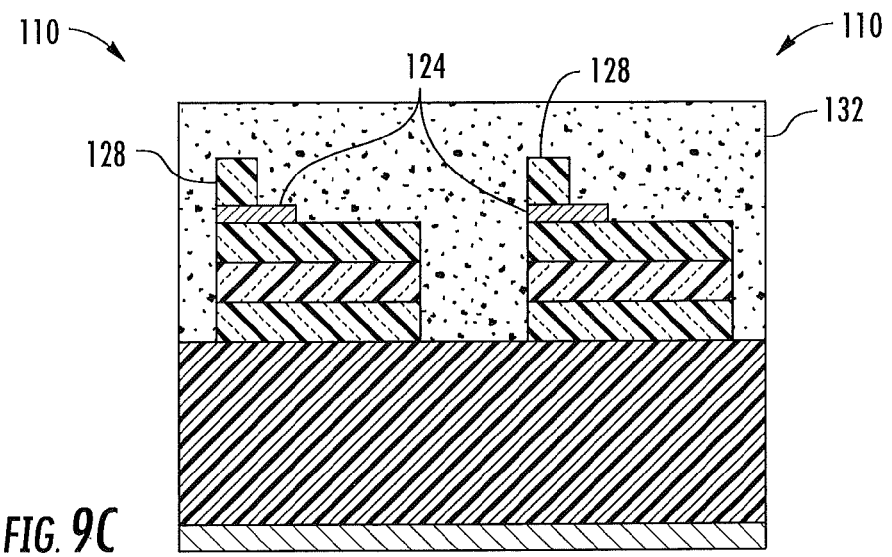
Figure 9D:
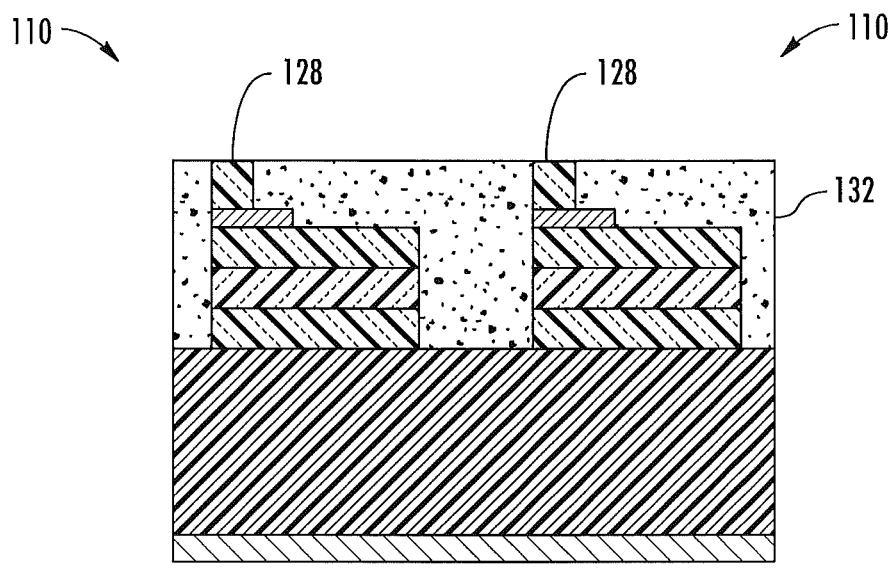

As shown in FIG. 9C, the wafer is blanketed by a recipient luminophoric medium coating 132 that covers each of the LED chips 110, the contacts 122, and the pedestal 128. The luminophoric medium coating 132 may comprise a binder and a plurality of phosphors. The phosphors may comprise, for example, the phosphor combinations discussed above according to embodiments of the present invention. The material used for the binder may be a material that is robust after curing and substantially transparent in the visible wavelength spectrum such as, for example, a silicone, epoxy, glass, inorganic glass, spin-on glass, dielectrics, BCB, polymides, polymers and the like. The luminophoric medium coating 132 can be applied using different processes such as spin coating, dispensing, electrophoretic deposition, electrostatic deposition, printing, jet printing or screen printing. Yet another suitable coating technique is disclosed in U.S. patent application Ser. No. 12/717,048, filed Mar. 3, 2010, the contents of which are incorporated herein by reference. The luminophoric medium coating 132 can then be cured using an appropriate curing method (e.g., heat, ultraviolet (UV), infrared (IR) or air curing).

Different factors determine the amount of LED light that will be absorbed by the luminophoric medium coating 132 in the final LED chips 110, including but not limited to the size of the phosphor particles, the percentage of phosphor loading, the type of binder material, the efficiency of the match between the type of phosphor and wavelength of emitted light, and the thickness of the luminophoric medium coating 132. Many different phosphors can be used in the recipient luminophoric medium coating 132 according to the present invention. As discussed above, in some embodiments, the recipient luminophoric medium coating 132 may include a green phosphor, a yellow phosphor and a red phosphor. The green phosphor may have a FWHM bandwidth that may extend into, or even all the way across, the cyan color range. The green phosphor may comprise, for example, LuAG:Ce. Other phosphors that emit at or near the green color range include, but are not limited to, $Sr_6P_5BO_{20}$:Eu; $MSi_2O_2N_2$:$Eu^{2+}$; and Zinc Sulfide:Ag with (Zn,Cd)S:Cu:Al, or other combinations. The yellow phosphor may comprise, for example, YAG:Ce. Other suitable yellow phosphors include $Tb_{3-x}RE_xO_{12}$:Ce(TAG) where RE=Y, Gd, La, Lu; and $Sr_{2-x-y}Ba_xCa_ySiO_4$:Eu. The red phosphor may comprise, for example, $(Ca_{1-x}Sr_x)SiAlN_3$:$Eu^{2+}$. Other red or orange phosphors that could be used in certain embodiments include $Lu_2O_3$:$Eu^{3+}$; $(Sr_{2-x}La_x)(Ce_{1-x}Eu_x)O_4$; $Sr_2Ce_{1-x}Eu_xO_4$; $Sr_{2-x}Eu_xCeO_4$; $SrTiO_3$:$Pr^{3+}$, $Ga^{3+}$; $CaAlSiN_3$:$Eu^{2+}$; and/or $Sr_2Si_5N_8$:$Eu^{2+}$. It will be understood that many other phosphors can used alone or in combination to achieve the desired combined spectral output.

Different sized phosphor particles can be used including, but not limited to, 10-100 nanometer (nm)-sized particles to 20-30 μm sized particles, or larger. Smaller particle sizes typically scatter and mix colors better than larger sized particles to provide a more uniform light. Larger particles are typically more efficient at converting light compared to smaller particles, but emit a less uniform light. The phosphor particles for the green, yellow and red phosphors may range in size from about 1 micron to about 30 microns, with about half of the particles being from between about 4 microns to about 20 microns. In some embodiments, at least half of the particles of the green, yellow and red phosphors may have a size (diameter) in the range between 2 microns and 20 microns. Different sized phosphors can be included in the recipient luminophoric medium coating 132 as desired before it is applied such that the end coating 132 can have the desired combination of smaller sizes to effectively scatter and mix the light, and larger sizes to efficiently convert the light.

The coating 132 can also have different concentrations or loading of phosphor materials in the binder, with a typical concentration being in range of 30-70% by weight. In one embodiment, the phosphor concentration is approximately 65% by weight, and is may be generally uniformly dispersed throughout the binder. In other embodiments the coating 132 can comprise multiple layers of different concentrations or types of phosphors, and the multiple layers can comprise different binder materials. One or more of the layers can be provided without phosphors. For example, a first coat of clear silicone can be deposited followed by phosphor loaded layers. As another example, the coating may comprise, for example, a three layer coating that includes a first layer having a first phosphor with a peak wavelength in the green color range directly on the LED chips 110, a second layer having a second phosphor with a peak wavelength in the yellow color range directly on the first layer, and a third layer having a third phosphor with a peak wavelength in the red color range directly on the second phosphor. Numerous other layer structures are possible, including multi-layers that include multiple phosphors in the same layer, and intervening layers or elements could also be provided between layers and/or between the coating and the underlying LED chips 110.

After the initial coating of the LED chips 110 with the recipient luminophoric medium coating 132, further processing is needed to expose the pedestal 128. Referring now the FIG. 9D, the coating 132 is thinned or planarized to expose the pedestals 128 through the top surface of the coating 132. The thinning process exposes the pedestals 128, planarizes the coating 132 and allows for control of the final thickness of the coating 132. Based on the operating characteristics of the LEDs 110 across the wafer and the properties of the phosphor (or fluorescent) material selected, the end thickness of the coating 132 can be calculated to reach a desired color point/range and still expose the pedestals 128. The thickness of the coating 132 can be uniform or non-uniform across the wafer.

Figure 9E:
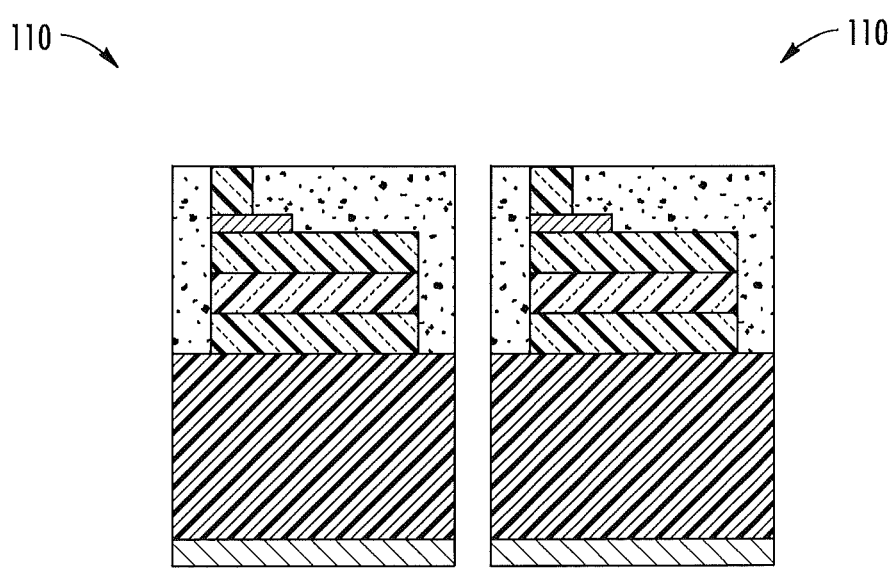

As shown in FIG. 9E, after the coating 132 is applied, the individual LED chips 110 can be singulated from the wafer using known methods such as dicing, scribe and breaking, or etching. The singulating process separates each of the LED chips 110 with each having substantially the same thickness of coating 132, and as a result, substantially the same amount of phosphor and thus substantially the same emission characteristics. Following singulation of the LED chips 110, a layer of coating 132 remains on the side surfaces of the LEDs 110 and light emitting from the side surfaces of the LEDs 110 also passes through the coating 132 and its phosphor particles. This results in conversion of at least some of the side emitting light, which can provide LED chips 110 having more consistent light emitting characteristics at different viewing angles.

Following singulation, the LED chips 110 can be mounted in a package, or to a submount or printed circuit board (PCB) without the need for further processing to add phosphor. In one embodiment the package/submount/PCB can have conventional package leads with the pedestals 128 electrically connected to the leads. A conventional encapsulation can then surround the LED chip 110 and electrical connections.

While the above coating process provides one exemplary method of fabricating the solid state light emitting devices according to embodiments of the present invention that include an LED and a recipient luminophoric medium, it will be appreciated that numerous other fabrication methods are available. For example, U.S. patent application Ser. No. 11/899,790, filed Sep. 7, 2007, the entire contents of which are incorporated herein by reference, discloses various additional methods of coating a recipient luminophoric medium coating onto a solid state light emitting device. In still other embodiments, light emitting devices an LED chip that may be mounted on a reflective cup by means of a solder bond or conductive epoxy, and the luminophoric medium may comprise an encapsulant material such as, for example, silicone that has the phosphors suspended therein. This luminophoric medium may be used, for example, to partially or completely fill the reflective cup.

It is understood that although the present invention has been described with respect to LEDs having vertical geometries, it may also be applied to LEDs having other geometries such as, for example, to lateral LEDs that have both contacts on the same side of the LED chip.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

While embodiments of the present invention have primarily been discussed above with respect to solid state light emitting devices that include LEDs, it will be appreciated that according to further embodiments of the present invention, laser diodes and/or other solid state lighting devices may be provided that include the luminophoric mediums discussed above. Thus, it will be appreciated that embodiments of the present invention are not limited to LEDs, but may include other solid state lighting devices such as laser diodes.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A light emitting device, comprising:
a light emitting diode that emits light having a dominant wavelength in the blue color range;
a recipient luminophoric medium on the light emitting diode for down-converting at least some of the radiation emitted by the light emitting diode, the luminophoric medium including:
a $Lu_3Al_5O_{12}$:Ce phosphor that does not include yttrium, the $Lu_3Al_5O_{12}$:Ce phosphor configured to down-convert the radiation emitted by the light emitting diode to radiation having a peak wavelength between 525 nanometers and 550 nanometers and that has a full width half maximum emission bandwidth that extends below 500 nanometers;

a $Y_3Al_5O_{12}$:Ce phosphor that does not include lutetium, the $Y_3Al_5O_{12}$:Ce phosphor configured to down-convert the radiation emitted by the light emitting diode to radiation having a peak wavelength between 530 nanometers and 580 nanometers; and an additional material that down-converts the radiation emitted by the light emitting diode to radiation having a peak wavelength between 630 nanometers and 650 nanometers, wherein the $Lu_3Al_5O_{12}$:Ce phosphor consists of a plurality of $Lu_3Al_5O_{12}$:Ce phosphor particles and the $Y_3Al_5O_{12}$:Ce phosphor consists of a plurality of $Y_3Al_5O_{12}$:Ce phosphor particles, and wherein a ratio of the $Lu_3Al_5O_{12}$:Ce phosphor to the $Y_3Al_5O_{12}$:Ce phosphor is between 1:3 and 3:1 by weight.

2. The light emitting device of claim 1, wherein the $Lu_3Al_5O_{12}$:Ce phosphor and the $Y_3Al_5O_{12}$:Ce phosphor are mixed together.

3. The light emitting device of claim 1, wherein the additional material comprises a nitride- or oxynitride-based phosphor.

4. The light emitting device of claim 1, wherein the additional material comprises a europium activated phosphor.

5. The light emitting device of claim 1, wherein the additional material comprises a $(Ca_{1-x}Sr_x)SiAlN_3$:$Eu^{2+}$ phosphor.

6. The light emitting device of claim 1, wherein the light emitting device emits a warm white light having a correlated color temperature between about 2500K and 3300K, and wherein the light emitting device has a CRI value of at least 90.

7. The light emitting device of claim 1, wherein the light emitted by the light emitting device has a color point that is within 7 MacAdam ellipses of the black-body locus on a 1931 CIE chromaticity diagram, a correlated color temperature of between about 2500K and about 3300K, and a CRT value of at least 90.

8. The light emitting device of claim 1, wherein the additional material comprises an additional phosphor, and wherein at least half the particles of the $Lu_3Al_5O_{12}$:Ce phosphor, the $Y_3Al_5O_{12}$:Ce phosphor and the additional phosphor are between about 2 microns and 24 microns in size.

9. The light emitting device of claim 1, wherein the additional material comprises a third phosphor, and wherein the ratio of the combination of the $Lu_3Al_5O_{12}$:Ce phosphor and the $Y_3Al_5O_{12}$:Ce phospho to the third phosphor is between 1:1 and 9:1 by weight.

10. A light emitting device, comprising:
a light emitting diode ("LED") that emits light having a dominant wavelength in the blue color range;
a recipient luminophoric medium on the light emitting diode that is configured to down-convert at least some of the light emitted by the LED, the recipient luminophoric medium including at least:
a first LuAG:Ce phosphor that consists of a plurality of phosphor particles having the chemical formula $Lu_3Al_5O_{12}$:Ce, wherein the LuAG:Ce phosphor down-converts the radiation emitted by the LED to radiation having a peak wavelength in the green color range and a full width half maximum emission bandwidth that extends into the cyan color range;
a second YAG:Ce phosphor that consists of a plurality of phosphor particles having the chemical formula $Y_3Al_5O_{12}$:Ce, the second YAG:Ce phosphor being separate from the first LuAG:Ce phosphor, wherein the YAG:Ce phosphor down-converts the radiation emitted by the LED to radiation having a peak wavelength between 545 nm and 565 nm; and
a third phosphor that down-converts the radiation emitted by the LED to radiation having a peak wavelength in the red color range, and
wherein a ratio of the first LuAG:Ce phosphor to the second YAG:Ce phosphor is between 1:3 and 3:1 by weight.

11. The light emitting device of claim 10, wherein the first LuAG:Ce phosphor, the second YAG:Ce phosphor and the third phosphor first, second and third phosphors and the LED are configured to together emit warm white light having a correlated color temperature between about 2500K and 3300K.

12. The light emitting device of claim 10, wherein the third phosphor comprises a $(Ca_{1-x}Sr_x)SiAlN_3$:$Eu^{2+}$ phosphor.

13. The light emitting device of claim 10, wherein the spectra of the light emission associated with the first LuAG:Ce phosphor, the second YAG:Ce phosphor and the third phosphor includes a single peak.

14. The light emitting device of claim 10, wherein the spectra of the light emission associated with the first LuAG:Ce phosphor does not generate a peak in the cyan color range.

15. A packaged light emitting device, comprising:
a submount;
a light emitting diode ("LED") that emits light having a dominant wavelength in the blue color range;
a recipient luminophoric medium that is configured to down-convert at least some of the light emitted by the LED coated on the LED, the recipient luminophoric medium including a plurality of $Lu_3Al_5O_{12}$:Ce phosphor particles that down-convert the radiation emitted by the LED to radiation having a peak wavelength between 525 nm and 550 nm and a full width half maximum emission bandwidth that extends into the cyan color range, a plurality of $Y_3Al_5O_{12}$:Ce phosphor particles that down-convert the radiation emitted by the LED to radiation having a peak wavelength between 530 nm and 580 nm, and a plurality of particles of a third phosphor which each down-convert the radiation emitted by the LED to a radiation having a peak wavelength in the red color range,
a lens on a top surface of the submount over the LED;
wherein the spectra emitted by the light emitting device has a total of two distinct peaks in the visible spectrum, including a first peak in the blue color range; and a second peak at wavelengths longer than the wavelengths associated with the green color range, and
wherein the light emitting device emits a warm white light having a correlated color temperature between about 2500K and 3300K, and wherein the light emitted by the light emitting device has a CRI value of at least 90, and wherein a ratio of the $Lu_3Al_5O_{12}$:Ce phosphor particles to the $Y_3Al_5O_{12}$:Ce phosphor particles is between 1:3 and 3:1 by weight.

16. The light emitting device of claim 10, wherein the LED is mounted in a flip-chip orientation.

17. The light emitting device of claim 16, wherein the light emission occurs through a substrate of the LED.

18. The light emitting device of claim 16, wherein an anode contact and a cathode contact of the LED are both on the same side of the LED.

19. The light emitting device of claim 15, wherein the LED is mounted in a flip-chip orientation.

20. The light emitting device of claim 19, wherein the light emission occurs through a substrate of the LED.

21. The light emitting device of claim 19, wherein an anode contact and a cathode contact of the LED are both on the same side of the LED.

22. The light emitting device of claim 10, wherein the first LuAG:Ce phosphor down-converts the radiation emitted by the LED to radiation having a peak wavelength between 535 nanometers and 545 nanometers.

\* \* \* \* \*

UNITED STATES PATENT AND TRADEMARK OFFICE
CERTIFICATE OF CORRECTION

PATENT NO. : 8,643,038 B2  Page 1 of 1
APPLICATION NO. : 12/720390
DATED : February 4, 2014
INVENTOR(S) : Collins et al.

It is certified that error appears in the above-identified patent and that said Letters Patent is hereby corrected as shown below:

In the Specification
Column 1, Line 9: Please replace "index ("CRT") values."
to read -- index ("CRI") values. --

Column 6, Lines 66 and 67: Please replace "and/or 2006/0221272,"
to read -- and/or 2006/0221272. --

In the Claims
Column 23, Claim 7, Line 42: Please correct "and a CRT value of"
to read -- and a CRI value of --

Column 23, Claim 9, Line 52: Please correct "the $Y_3Al_5O_{12}$:Ce phospho to"
to read -- the $Y_3Al_5O_{12}$:Ce phosphor to --

Column 24, Claim 11, Line 16: Please correct "and third phosphors and the LED"
to read -- and third phosphor and the LED --

Signed and Sealed this
Seventh Day of October, 2014

Michelle K. Lee
*Deputy Director of the United States Patent and Trademark Office*